(12) United States Patent
Zhang et al.

(10) Patent No.: US 7,412,681 B1
(45) Date of Patent: Aug. 12, 2008

(54) DC PATH CHECKING IN A HIERARCHICAL CIRCUIT DESIGN

(75) Inventors: Xiaodong Zhang, Union City, CA (US); Jun Kong, San Jose, CA (US); Bruce W. McGaughy, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 266 days.

(21) Appl. No.: 11/067,571

(22) Filed: Feb. 25, 2005

(51) Int. Cl.
*G06F 17/50* (2006.01)
(52) U.S. Cl. .................... 716/12; 716/1; 716/15
(58) Field of Classification Search ............ 716/1, 716/6, 12, 15
See application file for complete search history.

(56) References Cited

U.S. PATENT DOCUMENTS

| | | | |
|---|---|---|---|
| 5,446,676 A | 8/1995 | Huang et al. | |
| 5,553,008 A | 9/1996 | Huang et al. | |
| 7,024,652 B1 * | 4/2006 | McGaughy et al. | 716/12 |

OTHER PUBLICATIONS

Celestry Design Technologies, Inc. (2001). *Celestry BSIM Pro+™ Basic Operations*, User Manual, Version 2001.3, pp. iii-xiii. (Table of Contents Only).
Celestry Design Technologies, Inc. (2001). *Celestry BSIM Pro+™ Device Modeling Guide*, User Manual, Version 2001.3, pp. iii-xii. (Table of Contents Only).

* cited by examiner

*Primary Examiner*—Thuan Do
(74) *Attorney, Agent, or Firm*—Wheelock Chan LLP; Thomas Chan

(57) ABSTRACT

A computer implemented method is provided for use in evaluating a hierarchical representation of a circuit design encoded in a computer readable medium comprising: traversing a circuit path within a higher level circuit that includes a reference potential connection, to identify a port of a call to a first lower level circuit that is DC path connected to the reference potential; identifying a first DC port group that includes each port of the call to the first lower level circuit that is DC path connected to the identified port of the call to the first lower level circuit; automatically marking as DC path connected to the reference potential, each port of the call to the first lower level circuit that is a member of the first DC port group; and traversing a circuit path within the first lower level circuit to identify a circuit path within the first lower level circuit that is DC path connected to a marked port of the first lower level circuit.

16 Claims, 15 Drawing Sheets

(DC path to ground traversal)

(preprocessing)

(preprocessing)

(DC path to ground traversal)

US 7,412,681 B1

DC PATH CHECKING IN A HIERARCHICAL CIRCUIT DESIGN

BACKGROUND OF THE INVENTION

1. Field of the Invention

The invention relates in general to automated design of integrated circuits, and more particularly, to the use of hierarchical circuit designs in the simulation of integrated circuits.

2. Description of the Related Art

As the product development cycles continue to shorten, there is a need for the makers of SPICE-like simulators to come up with new ways to quickly and accurately predict the system-wide behaviors of these exponentially denser and more complex analog integrated circuit designs. In order to simulate a system, it is important to have a complete description of the system and its components. Ordinarily, system descriptions are given structurally. That is, the description of a system sets forth instances of components and their interconnections. Descriptions of primitive components may be provided behaviorally. For instance, a mathematical description may be provided to describe the signals at the ports of the components.

FIG. 1 is an illustrative drawing of a lumped network in which components (circuit modules) connect to nodes through ports. The lumped network includes a collection of nodes and branches. A node is a point of interconnection for branches, and a branch is a path between two nodes. The term port as used in connection with the Verilog language commonly means a terminal or pin. A more formal definition of the term port is a pair of related terminals for which only two quantities are important, the port voltage and the port current. The port voltage is the potential difference between the two terminals, and the port current flows between the two terminals. The current into one terminal must exactly equal the current out of the other. As used herein, however, port means a terminal or pin. See K. Kundert and O. Zinke, The Designer's Guide to Verilog AMS, Kluwer Academic Publishers, 2004, pages 46-47.

In a hierarchical circuit representation, circuit modules are represented as calls to branch circuits or to leaf circuits. A computer readable hierarchical representation of a circuit design may include a hierarchy of software calls. Each call corresponds to a branch circuit or to a leaf circuit. A call is a computer program instruction that instructs a computer program that uses the hierarchical design during simulation, for example, to retrieve a called circuit. In this manner, a branch or leaf circuit model can be retrieved and utilized during simulation.

In a circuit design represented by a hierarchical data structure, opportunities may exist for more efficient simulation processing of redundant or duplicative circuit behaviors that are sometimes exhibited by structurally redundant subcomponents of the hierarchical circuit structure. Examples of integrated circuits which tend to exhibit extensive hierarchical data structure include high-density memory chips such as SRAMs, DRAMs, EEPROMs, etc. Parallel data processing systems and telecommunication systems also tend to have hierarchical structures with redundant subcomponents, for example.

FIG. 2 is an illustrative conceptual diagram of an example of a typical memory circuit design that has a repetitive structure. The memory circuit design includes 64,000 repetitive columns 202. Each of the columns includes 512 repetitive rows. Each row is represented by a row branch circuit 204 which in turn calls to a leaf circuit 206. The 512 repetitive rows in the column are connected together through respective nodes 208, and each node is driven by a respective sense amplifier 210.

More specifically, each row is a subcircuit that is a branch 204 in the design that includes an instance of the leaf circuit 206. The leaf circuit 206 is represented in the hierarchy structure as a call that instructs a simulator program processing the hierarchy to reference the leaf circuit instance. Thus, a single leaf circuit representation is stored, although it may be referenced by numerous calls throughout a circuit hierarchy representing a circuit design.

FIG. 3 is an illustrative drawing of a hierarchical data structure representation of the example memory circuit of FIG. 2. A top level circuit is designated as the Root which represents substantially all column sub-circuits as calls C1 to C64000, where call represents a column of the memory circuit. Each column includes a call to substantially the same row circuits from R1 to R512, each representing a row of the memory circuit. Each row includes a call to substantially the same leaf circuit. This example hierarchical representation shows that identical circuit components that are repeated throughout a design may be more efficiently represented in a hierarchical structure as calls to such repetitive components. In particular, in the Root level 308, there are 64000 substantially the same instances of the same column block, represented by calls C1 to C64000. At the row circuit block level 310, there are 512 substantially the same instances of the same leaf circuit, represented by calls R1 to R512 to the leaf circuit 312. At the leaf circuit level 312, there is only one instance of the leaf circuit 312.

Simulation of a circuit design often involves traversal of the circuit design from one node to another in order to evaluate some aspect of the design such as whether a node has a DC path to ground, whether a node is connected to a ground voltage source, whether a node has some initial condition or whether a node should be considered for dynamic partitioning, for example, within the design. For instance, a topological check of a circuit design may involve traversal of all DC paths of all circuit elements of a circuit design. In a circuit design represented as a hierarchical structure, a traverse of a circuit design during simulation may cross from one level of the circuit hierarchy to a different level of the circuit hierarchy.

Traversal of a hierarchical circuit design presents a special challenge since numerous distinct circuit elements may be represented in the design by references to a single element. For instance, each of the row elements R1 to R512 of the example design of FIG. 3 references the leaf circuit 312, and each reference represents a distinct occurrence of the leaf circuit in the circuit design. Moreover, references to different distinct circuit elements in a design may be embedded in different levels of a multi-level hierarchy. For example, each of the column elements C1 to C64000 of the root level block 308 of the design of FIG. 3 references the branch level row block 310 of the design, that includes row elements R1 to R512. Each reface to the row block 310 represents a distinct occurrence of the collection of row elements R1 to R512. However, typically, only one instance of the row block 310 is stored in the database that contains the circuit design hierarchy. Also, each of the branch level row elements R1 to R512 references the leaf circuit at the leaf circuit level of the design. Each reference to the leaf circuit 312 represents a distinct occurrence of the leaf circuit 312 in the design hierarchy. The challenge is to permit selective traversal of each and every circuit element of the design despite the fact that numerous distinct occurrences of any given circuit element may be represented by a single reference (e.g., branch circuit or leaf circuit) in the hierarchical structure that represents the circuit design.

One approach to circuit design traversal involves flattening a hierarchical circuit design structure. However, flattening an entire circuit design may be impractical in the case of large design databases, such as for a typical DRAM design, for example. More specifically, flattening an entire design may exhaust computational memory resources and may be too expensive in terms of computational time.

Another approach is to partially flatten a hierarchical design. For example, the UltraSim simulator produced by Cadence Design Systems, with a place of business at San Jose, Calif., used a partial flattening technique in which a ground node in a root circuit is identified, and then starting from that identified ground node, attempt is made to dig out all grounded "v" sources from the entire hierarchy. One shortcoming of this approach is that it can break or distort the original circuit design hierarchy.

Accurate simulation results for a hierarchical circuit design can be hampered by the fact that a property of an instance of a called circuit may depend upon a corresponding property of a higher level calling circuit, for example. Referring to FIG. 4, there is shown an illustrative drawing of a hypothetical hierarchical circuit design in which multiple root level subcircuits call the same leaf level circuit. More specifically, within a single root circuit there are four instances of the same subcircuit, labeled subcircuit 1, subcircuit 2, subcircuit 3 and subcircuit 4. All four instances call the same lower level leaf circuit. Assume that a simulation process seeks to identify DC paths to ground through traversal of the illustrated circuit design. The traversal process would determine that, although ports of subcircuits 1-2 have DC paths to ground through resistors R1 and R2, capacitors C1 and C2 block corresponding ports of subcircuits 3-4 from having DC paths to ground. If the DC path traversal of the root circuit was to result in marking the leaf circuit as having a DC path to ground (based upon the DC paths associated with subcircuits 1-2), then such marking would be correct for subcircuits 1-2 but not for subcircuits 3-4. On the other hand, if the DC path traversal of the root circuit was to result in marking the leaf circuit as not having a DC path to ground (based upon the DC paths associated with subcircuits 3-4), then such marking would be correct for subcircuits 3-4 but not for subcircuits 1-2. Thus, the state of the DC path to ground property for each of the higher level calling subcircuits 1-4 affects the state of the DC path to ground property of the leaf circuit that is called by these higher level calling subcircuits 1-4.

Efficiency in the simulation of a hierarchical design can be hampered by repeated traversals of the same called circuit, for example. Referring to FIG. 5, there is shown an illustrative drawing of another hypothetical hierarchical circuit design in which multiple root level subcircuits call the same leaf level circuit. More particularly, within a single root circuit there are four instances of the same subcircuit, labeled subcircuit 5, subcircuit 6, subcircuit 7 and subcircuit 8. All four instances call the same lower level leaf circuit. Assume that a simulation process requires traversal of the entire root circuit and all of its calls. Further assume that traversal begins at node C. One hypothetical example traversal involves stepping into the subcircuit 6 and then stepping down in the hierarchy to the leaf circuit, which is at a lower level of the hierarchy below the root level. The traversal process traverses the leaf circuit. Next, the traversal process steps back up in the hierarchy to node B, which is at the root level. The traversal steps into subcircuit 5, and then again steps down in the hierarchy to the leaf circuit, which is at a level of the hierarchy below the root level. Next, the traversal process steps back up in the hierarchy to node A, which is at the root level. In a similar manner, the hypothetical traversal further involves stepping into the subcircuit 7 and then stepping down in the hierarchy to the leaf circuit, a lower level of the hierarchy below the root level. The traversal process traverses the leaf circuit. Next, the traversal process steps back up in the hierarchy to node D, which is at the root level. The traversal steps into subcircuit 8, and then again steps down in the hierarchy to the leaf circuit. Next, the traversal process steps back up in the hierarchy to node E, which is at the root level. In this hypothetical example, the leaf circuit is traversed four times, which is inefficient.

Thus, there has been a need for an improved accurate and efficient approach to traversal of a circuit design represented in computer memory as a hierarchical structure. The present invention meets this need.

SUMMARY OF THE INVENTION

One aspect of the invention involves the use of DC port groups to improve DC path traversal within a hierarchical circuit design. In a system and method in accordance with one embodiment of the invention, at least a portion of a higher level circuit in the design that includes a connection to a reference potential is traversed to identify a port of a call to a first lower level circuit that is DC path connected to the reference potential. A first DC port group is identified that includes each port of the call to the first lower level circuit that is DC path connected to the identified port of the call to the first lower level circuit. Each port of the call to the first lower level circuit that is a member of the first DC port group is automatically marked as DC path connected to the reference potential. At least a portion of the first lower level circuit is traversed to identify a circuit path within the first lower level circuit that is DC path connected to a port of the called first lower level circuit that has been marked. DC path traversal efficiency is provided, since DC port groups obviate the need to step down in a circuit design hierarchy to traverse DC paths between ports of a call that are in the same DC port group.

A further aspect of an embodiment of the invention employs preprocessing of a hierarchical design to identify DC port groups that can be useful later during a DC path traversal. A method and system in accordance with one embodiment involves also traversing at least a portion of the first lower level circuit to identify at least one or both of a first lower level circuit node or a port of a second lower level circuit that is DC path connected to a marked port of the first lower level circuit. This further identifies a second DC port group that includes each one or more ports of the call to the second lower level circuit that is DC path connected to the identified port of the call to the second lower level circuit. The one or more ports of the second DC port group that includes the identified port of the call to the second lower level circuit are marked automatically as being DC path connected to the reference potential. At least a portion of the second lower level circuit is traversed to identify one or both of a second lower level circuit node or a port of a third lower level circuit that is DC path connected to a marked port of the second lower level circuit. Before the step of traversing at least a portion of the higher level circuit, the second DC port group is produced by traversing at least a portion of the second lower level circuit to identify ports that are DC path connected to each other. Also, before the step of traversing at least a portion of the higher level circuit and after the step of producing the second DC port group, the first DC port group is produced by traversing at least a portion of the first lower level circuit to identify ports that are DC path connected to each other. Moreover, during the step of producing the first DC port group, the second DC port group is referenced to identify DC paths within a call to the second lower level. Therefore, a hierarchical design database is preprocessed to produce DC port groups that will be useful later during the DC path traversal.

Yet another aspect of an embodiment of the invention provides for traversals down through a hierarchical circuit design to different instances of a lower level circuit model that have different DC port signatures without distortion of the hierarchical representation. In one embodiment of a system and method, at least a portion of a higher level circuit in the design that includes a reference potential connection is traversed to identify a port of a call to a first lower level circuit that is DC path connected to the reference potential. A DC port signature is determined for a call to the first lower level circuit in the design identified as having a port DC connected to reference potential. A new instance of the first lower level circuit in the design is produced, which corresponds to the DC port signature and represents the call to the first lower level circuit having the identified port. At least a portion of the new instance of the first lower level circuit is traversed to identify at least a portion of the first lower level circuit that is DC path connected to the port of the new instance of the first lower level circuit that is identified as DC path connected to the reference potential. Thus, the new instance is inserted in the design and is used during a traversal of the call to the port identified as DC connected to reference potential.

DETAILED DESCRIPTION OF THE PREFERRED EMBODIMENTS

Figure 1:
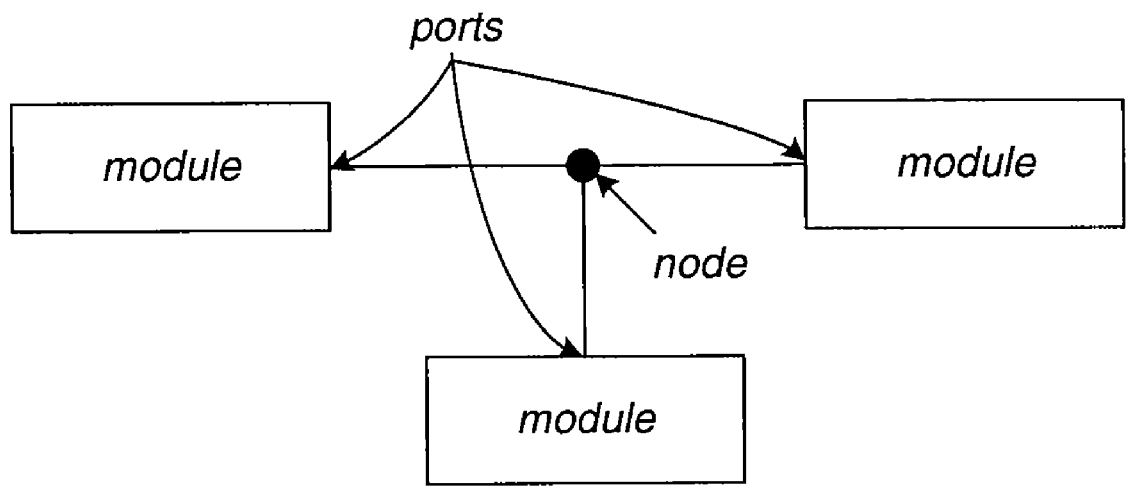
FIG. 1 is an illustrative drawing of a lumped network in which components (circuit modules) connect to nodes through ports.
Figure 2:
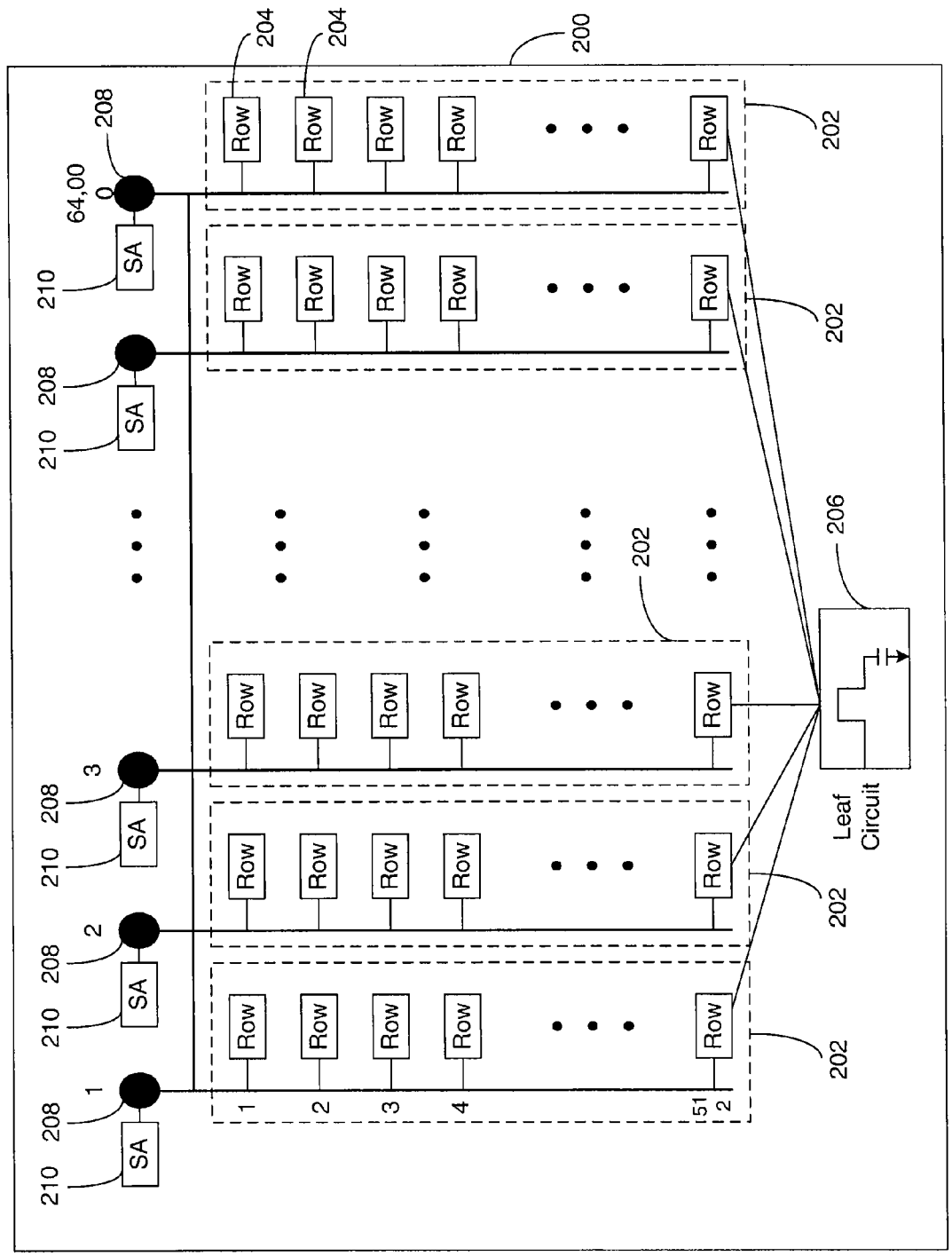
FIG. 2 is an illustrative conceptual diagram of an example of a typical memory circuit design that has a repetitive structure.
Figure 3:
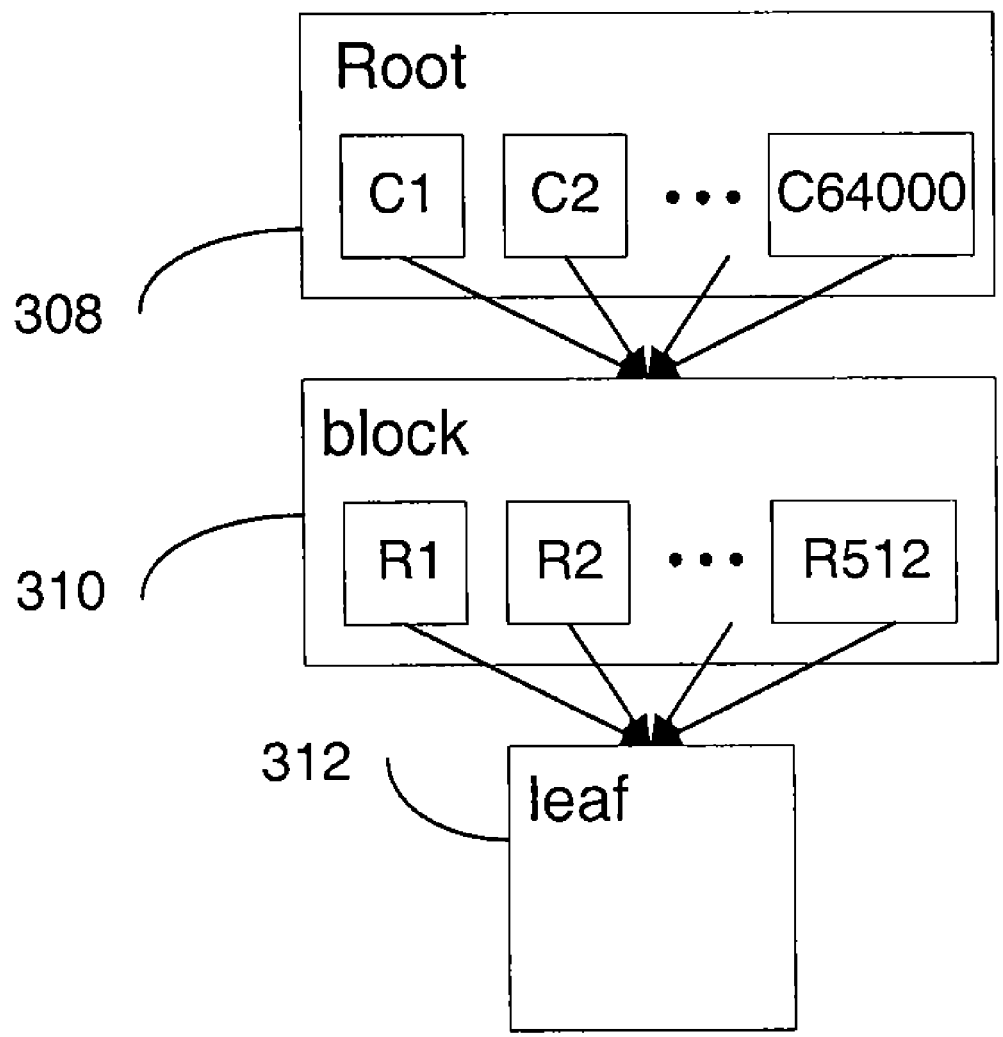
FIG. 3 is an illustrative drawing of a hierarchical data structure representation of the example memory circuit of FIG. 2.
Figure 4:
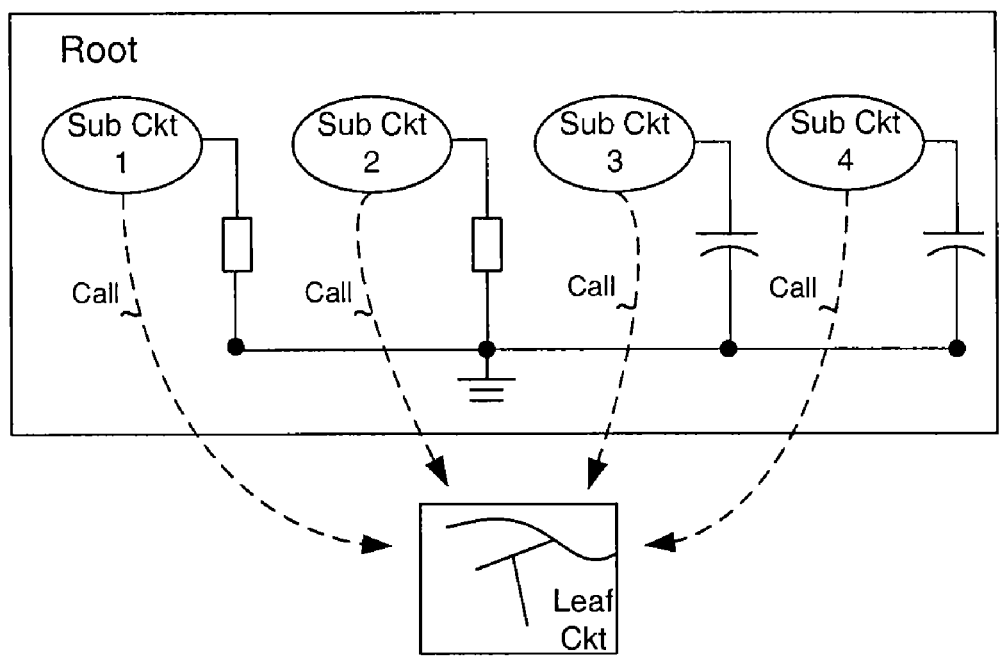
FIG. 4, there is shown an illustrative drawing of a hypothetical hierarchical circuit design in which multiple root level subcircuits call the same leaf level circuit.
Figure 5:
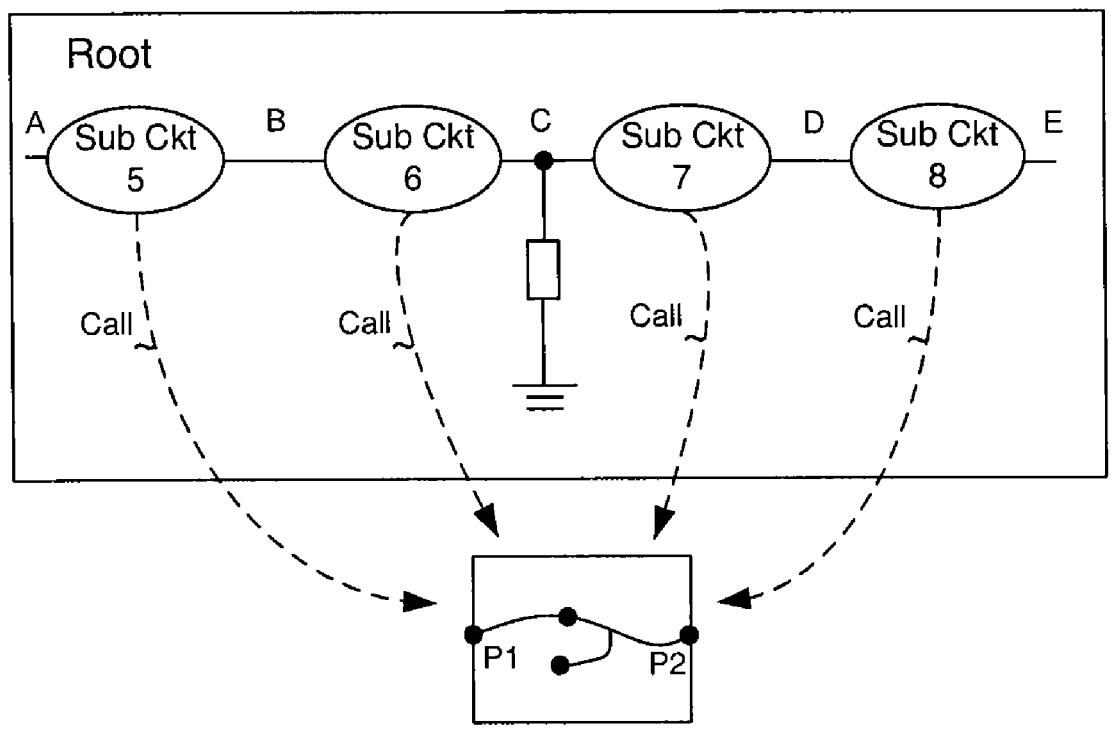
FIG. 5, there is shown an illustrative drawing of another hypothetical hierarchical circuit design in which multiple root level subcircuits call the same leaf level circuit.

The following description is presented to enable any person skilled in the art to make and use the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

Preprocessing

In one embodiment of the invention, a bottom-up preprocessing process seeks to identify groups of ports that have DC paths between them. The DC paths may be within a leaf circuit, within a branch circuit, or within a root circuit, for example. DC paths within a branch circuit may encompass DC paths within a call within the branch circuit; such a call may comprise a leaf circuit or another branch circuit, for example. Similarly, DC paths within a root circuit may encompass DC paths within a call within the root circuit; such call may comprise a branch circuit or a leaf circuit, for example.

The term call is used to designate an instruction used to retrieve a called circuit module such as a branch or leaf circuit. More specifically, the term call in the computer software context generally signifies a computer program instruction to get or to access some specified information from computer program memory. The term call, as used herein, also signifies the called information, such as a branch circuit or leaf circuit that such computer program call instructs the program to get or to access. Thus, the term call is used interchangeably to signify the computer instruction and to signify the called module.

A person skilled in the art will understand from the discussion herein that a root circuit, branch circuit and leaf circuit each represent different levels of a circuit design hierarchy. The root circuit is at a higher level of the hierarchy than either the root circuit or the leaf circuit. The branch circuit is at a higher level of the circuit hierarchy than the leaf circuit. There may be many different kinds of root circuits, many different kinds of branch circuits and many different kinds of leaf circuits. A multi-level circuit design hierarchy may have many levels of branch circuits, for example. More generally, a branch circuit may be described as being a first lower level circuit relative to a higher level (root) circuit or as being a second lower level circuit relative to a first lower level (branch) circuit. Similarly, a leaf circuit may be described as being a first lower level circuit relative to a root circuit or as being a second lower level circuit relative to a first lower level (branch) circuit, for example.

The preprocessing process records groups of ports that have DC paths between them. More particularly, the preprocessing process identifies and records DC path port groups in which group members have DC paths between them. For example, two ports that are members of different DC path port groups, or that are not members of any port groups, do not have DC paths between them.

Preprocessing proceeds within a circuit hierarchy in a bottom-up direction starting at a port of a given circuit and traversing through nodes within the circuit. Preprocessing starts at a leaf circuit level of the hierarchy and progresses up through branch circuit levels. There may be multiple types of leaf circuits, and there may be multiple types and levels of branch circuits. Each type of leaf circuit and each type of branch circuit is preprocessed. If there are multiple levels of branch circuits, then preprocessing proceeds level-by-level up through the branch levels. Preprocessing also may progress from the branch circuit level to a root circuit level.

A circuit iterator structure, which forms no part of the present invention and which will be readily understood by persons skilled in the art, provides a map of the hierarchy levels of a hierarchical circuit design structure. This map guides traversals between circuit hierarchy levels.

Preprocessing, level-by-level, involves evaluation of circuit components, e.g., leaf circuits and branch circuits, to identify DC paths within circuit components of a circuit hierarchy. In general, for a DC path to exist between two given ports, there should be no circuit element that blocks a DC signal. A DC path evaluation process in accordance with one embodiment of the invention, involves attempts at DC traversal across circuit elements from port-to-port within a circuit component in order to identify DC paths between such ports. A DC path between ports of an element is identified when there is a successful traversal along a DC path between such ports within a circuit element, e.g., leaf circuit or branch circuit. If all circuit elements along a given circuit path from one port to another port permit passage of a DC signal, then DC traversal is successful, and the given path is determined to be a DC path between the ports. However, if there is a circuit element that blocks passage of a DC signal, then DC traversal is unsuccessful, and the given path is determined not to be a DC path between the ports.

The following chart sets forth the DC path properties of several example circuit elements that may be present in a circuit path between nodes. The following chart provides a set of examples and is not intended to be a comprehensive list.

DC Path Properties of Selected Circuit Elements

| CIRCUIT ELEMENT TYPE | DC_PATH |
|---|---|
| Bipolar Junction Transistor | Yes |
| Diode | Yes |
| Resistor | Yes |
| Inductor | Yes |
| Voltage Source | Yes |
| Current Source | No |
| Wire Load | Yes |

-continued

DC Path Properties of Selected Circuit Elements

| CIRCUIT ELEMENT TYPE | DC_PATH |
|---|---|
| Lossy Transmission Line | No |
| MOSFET | Yes-excluding gate |
| Junction Effect Transistor | Yes |
| Vector | Yes |

Hierarchical circuit components lower in a circuit hierarchy are evaluated first so that preprocessing results for circuit components lower in the hierarchy can be used during preprocessing of circuit components higher up in the hierarchy. That is, for example, a circuit component that is called by another circuit component higher up in the circuit hierarchy is preprocessed before the preprocessing of the higher level calling circuit component. Thus, as the preprocessing process progresses from the bottom toward the top of a circuit hierarchy, DC path port groups identified for circuit components lower in the hierarchy can be used to more efficiently evaluate possible DC paths within circuit components higher up in the hierarchy.

During preprocessing higher level circuit components, the use of DC port group information developed previously during preprocessing of lower level circuit components, can obviate the need to step down into the lower level circuit component to glean DC path information. Preprocessing of a higher level circuit component that calls a previously preprocessed lower level circuit component, may effect a DC traversal of such lower level circuit element as if it was a 'black box'. That is, the traversal may proceed by jumping automatically from port-to-port across the lower level circuit component for those ports of the lower level circuit component identified as members of the same DC port group. Conversely, during preprocessing of such higher level circuit element, it may be determined that there can be no DC traversal of such lower level circuit between ports of that lower level circuit element that are members of different port groups, or that are not members of any DC port group. Thus, DC path traversal information gleaned during preprocessing of lower level circuit elements is used to more efficiently preprocess higher level circuit elements that call such lower level circuit elements.

More particularly, for example, assume that DC traversal of circuit paths within a leaf circuit during preprocessing determines which ports of a given leaf circuit are interconnected by a DC path and which are not. DC traversal preprocessing assigns ports of the given leaf circuit to the same DC port group if they have a DC path between. Further, assume that a branch circuit includes a circuit path with a call to the given leaf circuit. DC traversal preprocessing of a circuit path within the branch circuit that includes a call to the given leaf circuit may be expedited by reference to previously determined DC port group information. Specifically, for example, DC traversal preprocessing automatically determines that there is a DC path across a call to the given leaf circuit if the leaf circuit ports associated with a given branch circuit path are members of the same DC port group. Conversely, the DC traversal preprocessing automatically determines that there is not a DC path across a call to the given leaf circuit if the leaf circuit ports associated with a given branch circuit path are not members of the same DC port group. As used herein, 'automatically determines' means that a DC path determination is made based upon DC port group information without the need to step down in the circuit hierarchy to (again) traverse a given lower level (e.g., leaf) circuit to ascertain its internal DC paths.

Figure 6A:
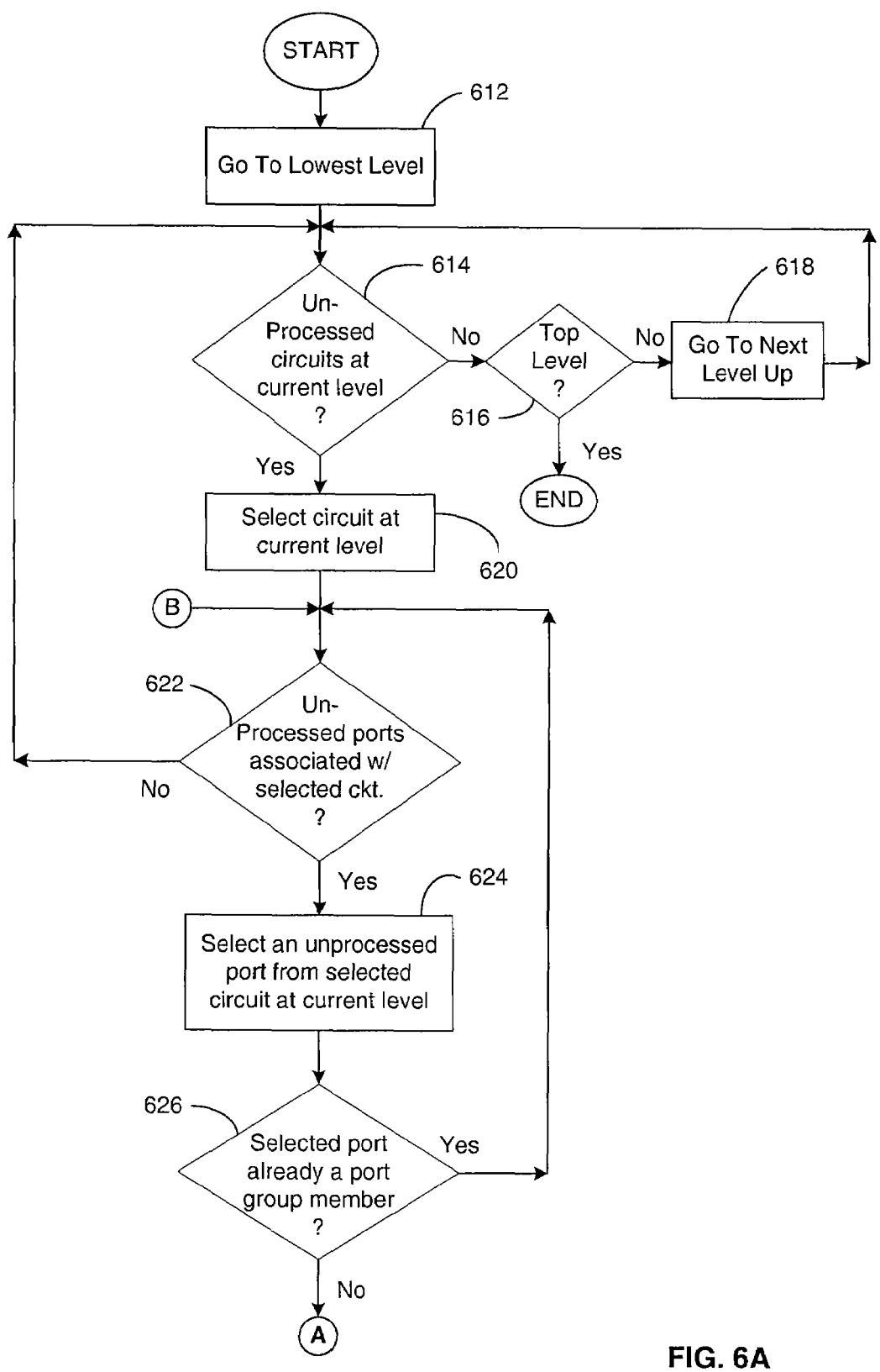
FIGS. 6A-6B are an illustrative flow diagram representing computer program controlled preprocessing of a hierarchical circuit representation in accordance with one embodiment of the invention.
Figure 6B:
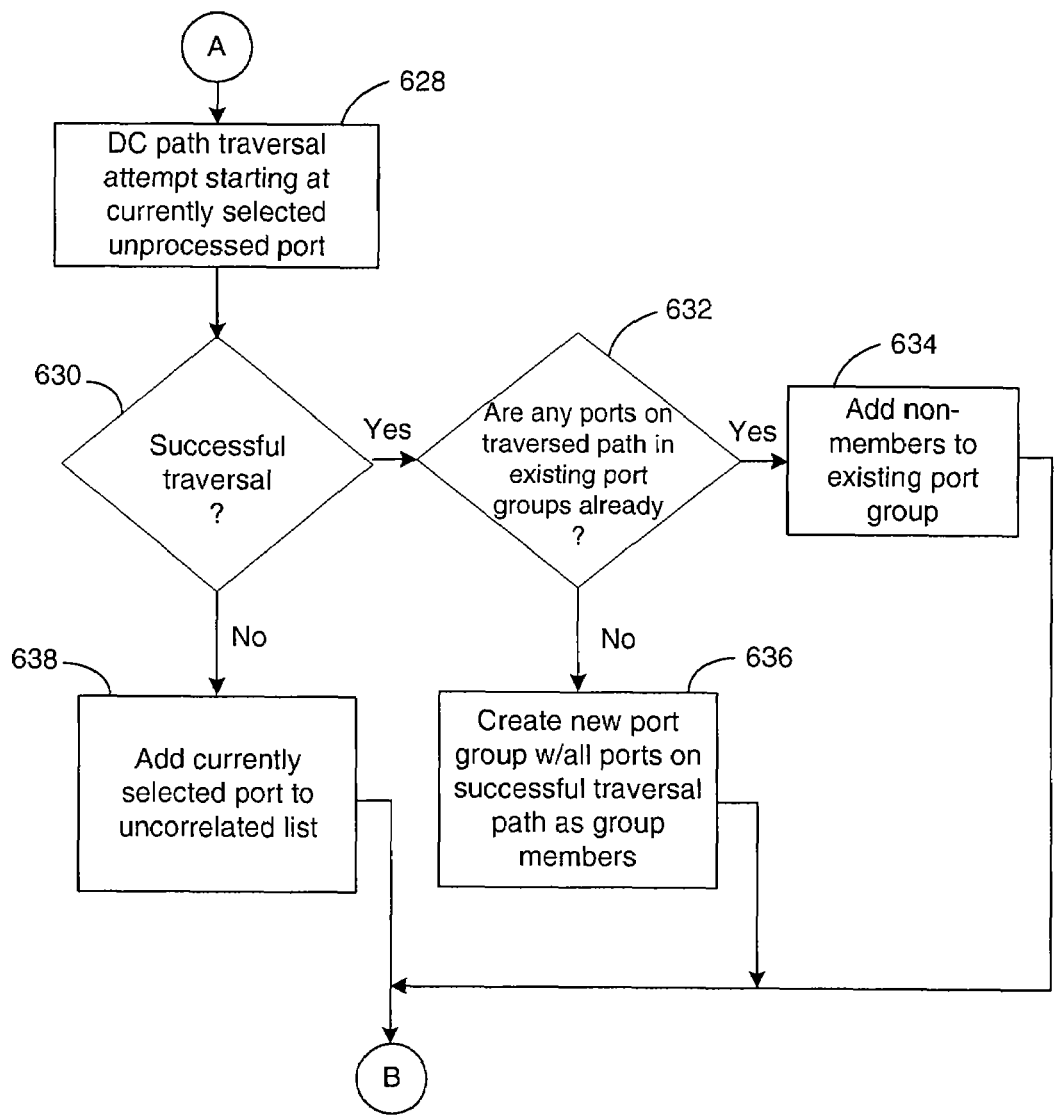

FIGS. 6A-6B are an illustrative flow diagram representing computer program controlled preprocessing of a hierarchical circuit representation in accordance with one embodiment of the invention. It will be appreciated that the flow of FIGS. 6A-6B represents a computer program controlled process that can be used to program a general purpose computer to implement the preprocessing process. Preprocessing begins at the lowest level of the circuit of a circuit hierarchy as indicated by Step 612. In Step 614, a determination is made as to whether or not there are unprocessed circuit components at a level of the hierarchy that currently is the focus of preprocessing. If there are no unprocessed circuit components at this current level of the circuit hierarchy, then in Step 616 a determination is made as to whether this current level of the hierarchy is the top level of the hierarchy. If the current level is the top level of the hierarchy then the preprocessing ends. However, if the level of the circuit hierarchy currently undergoing preprocessing is not the top level of the hierarchy, then in Step 618 preprocessing moves up in the circuit hierarchy to a next level up in the hierarchy and returns again to decision Step 614.

If in decision Step 614 a determination is made that there remain unprocessed circuits at this current level of the hierarchy, then in Step 620, one of the remaining unprocessed circuits at the current level of the hierarchy is selected for preprocessing. In decision Step 622, a determination is made as to whether or not there are unprocessed ports associated with the currently selected circuit at this current level of the circuit hierarchy. If a determination is made that there are no further unprocessed ports associated with the selected circuit, then preprocessing returns to decision Step 614, which determines whether there are additional unprocessed circuits at this current level of the hierarchy.

If, on the other hand, decision Step 622 determines that there are unprocessed ports associated with the currently selected circuit at the current level of the circuit hierarchy, then in Step 624 an unprocessed port of the selected circuit is chosen for preprocessing. In decision Step 626 a determination is made as to whether the chosen port already is a member of a previously identified port group. If so, then preprocessing returns to decision Step 622, which determines whether there is another unprocessed port associated with the selected circuit.

If the decision Step 626 determines that the selected port is not already a member of a port group, then Step 628 attempts a DC circuit path traversal starting at the currently selected port. Circuit path traversal during preprocessing involves a computer program controlled process that follows a circuit path within the circuit design. The circuit path may be within a root circuit, a branch circuit or a leaf circuit. DC circuit path traversal starts at the currently selected port and proceeds until it arrives at another port or until it arrives at a circuit element, such as a capacitor, that blocks DC signals. Only if the DC path traversal successfully proceeds from a selected port of a circuit to another port of a circuit, is a determination made that there is a DC path between those ports.

In decision Step 630, there is a determination as to whether the attempted DC path traversal starting with the currently selected port has been successful. If the traversal has been successful, then in decision Step 632 a determination is made as to whether the currently selected port and one or more other ports at the other end of the traversal path which has just been traversed, already are members of a port group. If decision Step 632 determines that the beginning or any ending ports on the path just successfully traversed already is a member of a port group, then the other beginning or ending ports on the successfully traversed path are added as members of that existing port group in Step 634. On the other hand, if decision Step 632 determines that neither the port at the beginning nor any port at another end of the path just traversed currently is a member of an existing port group, then in Step 636 a new port group is established with the beginning and all end ports included as members of a new port group.

If decision Step 630 determines that the attempted traversal of the path beginning with the currently selected port has been unsuccessful, then in Step 638 the currently selected port is added to a list of uncorrelated ports.

Following Step 634 or 636 or 638, whichever one occurs at this juncture, preprocessing returns to decision Step 622, where a determination is made as to whether there remain unprocessed ports associated with the currently selected circuit component.

DC Path to Ground Traversal and Database Splitting

In one embodiment, a DC path traversal process uses preprocessing results during a search to identify DC paths to ground in a hierarchical circuit design representation. The DC path to ground traversal process proceeds in a direction from higher levels of a circuit design hierarchy to lower levels of the circuit design hierarchy. In the course of the top-down DC traversal, a circuit splitting process may dynamically modify representations of circuit components (e.g., leaf circuits or branch circuits) stored in a database.

DC path port group information developed during preprocessing makes the traversal more efficient since it can obviate the need to repeatedly traverse preprocessed circuit components, e.g., leaf circuits or branch circuits. Basically, DC path port group information indicates correlations among ports, which can obviate the need to actually traverse paths within a called circuit component to identify a DC path during the DC path to ground traversal. Modification of the database through circuit splitting can subdivide a given call, e.g., a leaf circuit or branch circuit, into separate instances, such as a call instance that is not floating relative to ground potential and at least one other call instance that is floating relative to ground potential, for example.

Generally speaking, the DC path to ground traversal proceeds in a breadth first fashion in a top to bottom direction within a circuit hierarchy. For example, if there is a node that is connected to a ground (or reference) potential at a higher level of a circuit hierarchy, then the traversal process proceeds from that node. The DC path to ground traversal process traverses all nodes at that higher level of the circuit design hierarchy to ascertain which nodes are connected to ground and which nodes are not connected to ground. For a call within the higher level circuit, a determination is made as to whether a port of such call is associated (i.e., is connected on the same circuit path) with a node of the higher level circuit determined to be DC connected to ground. If the call is associated with a higher level circuit node determined to be DC path connected to ground, then the DC path to ground traversal process proceeds downward through the hierarchy to the called lower level circuit, starting with the port of that call associated with the node that is DC connected to ground.

At a next level down in the circuit design hierarchy, the DC path to ground traversal process traverses a circuit path within the next lower level circuit to determine whether at least a portion of that circuit path is DC path connected to the port of the called next lower level down circuit determined to be DC connected to ground. That portion may include one or both of a node of such next lower level down circuit or a port of call to an even lower down in the hierarchy circuit called by such next level down circuit, for example.

The DC path to ground traversal process references DC port groups to expedite the circuit path traversal within a call. For example, if a given port of a call is determined to be associated with a higher level circuit node that is connected to a DC path to ground, then all other ports of that instance of the call that are in the same DC port group as that given port are automatically determined to be DC connected to ground. By 'automatically determined' it is meant that a DC path connection to ground determination is made for certain ports of the call based upon DC port group information without the need to (again) traverse the internal circuit paths of the called circuit.

A circuit hierarchy can be split in the course of a traversal to account for a given call having at least one instance determined to be floating and another instance determined to be not floating within a circuit hierarchy. For example, one call to a given circuit component, e.g., a branch circuit or a leaf circuit, may be identified in the course of a circuit hierarchy traversal as being not floating, i.e., as having a connection to a DC path to ground, and another call to that same given circuit component may be identified as being floating, i.e., as not having a connection to a DC path to ground. In such a case, the circuit hierarchy can be split so as to include separate instances of the given call, one instance that is marked as not floating and another instance that is marked as not floating. In one embodiment, a new instance of a call is produced for each different DC port signature identified for the call in the course of the DC path to ground traversal. Thus, multiple instances of a single call may be produced, each corresponding to a different DC port signature. A call's DC port signature indicates which ports of a call are DC connected to ground and which are not.

Basically, a given call may occur multiple times in a hierarchical circuit design. For example, the DC path to ground traversal process may determine that one occurrence of the call has a DC port signature that does not include a DC connection to ground. The DC path to ground traversal process also may determine that another occurrence of the same call has a DC port signature that does include a DC connection to ground. By creating a new call instance for each of these two call occurrences, each can be separately traversed without the need to disrupting the circuit hierarchy. Thus, the circuit design hierarchy is maintained, despite different occurrences of a call having different DC path to ground relationships within the hierarchy.

In this overall manner, the DC path to ground process proceeds to identify nodes within a given level of a circuit design hierarchy that are connected to ground; and to then progress downward within the circuit design hierarchy from respective nodes determined to be DC connected to ground at the given level of the hierarchy, to respective ports of calls associated with such nodes. In order to avoid disruption of the hierarchy, in one embodiment, a new instance of a given call is created for each different port signature identified for the given call within the hierarchy. Also, in order to expedite processing in one embodiment, DC port group information is used to automatically identify all other ports that are DC connected to a given port determined to be DC connected to ground.

Figure 7A:
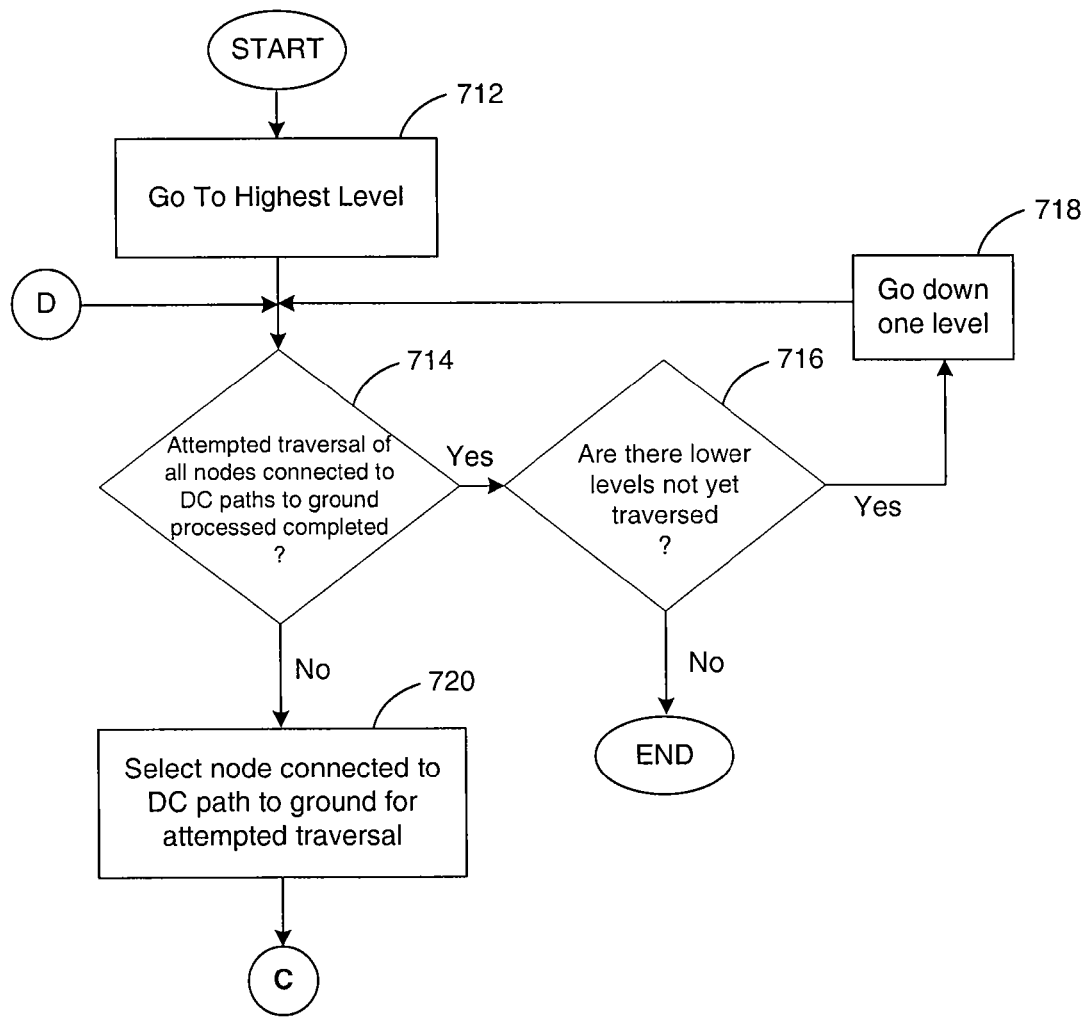
FIGS. 7A-7B provide an illustrative flow diagram representing a computer program controlled DC path to ground traversal process through a hierarchical circuit representation in accordance with an embodiment of the invention.
Figure 7B:
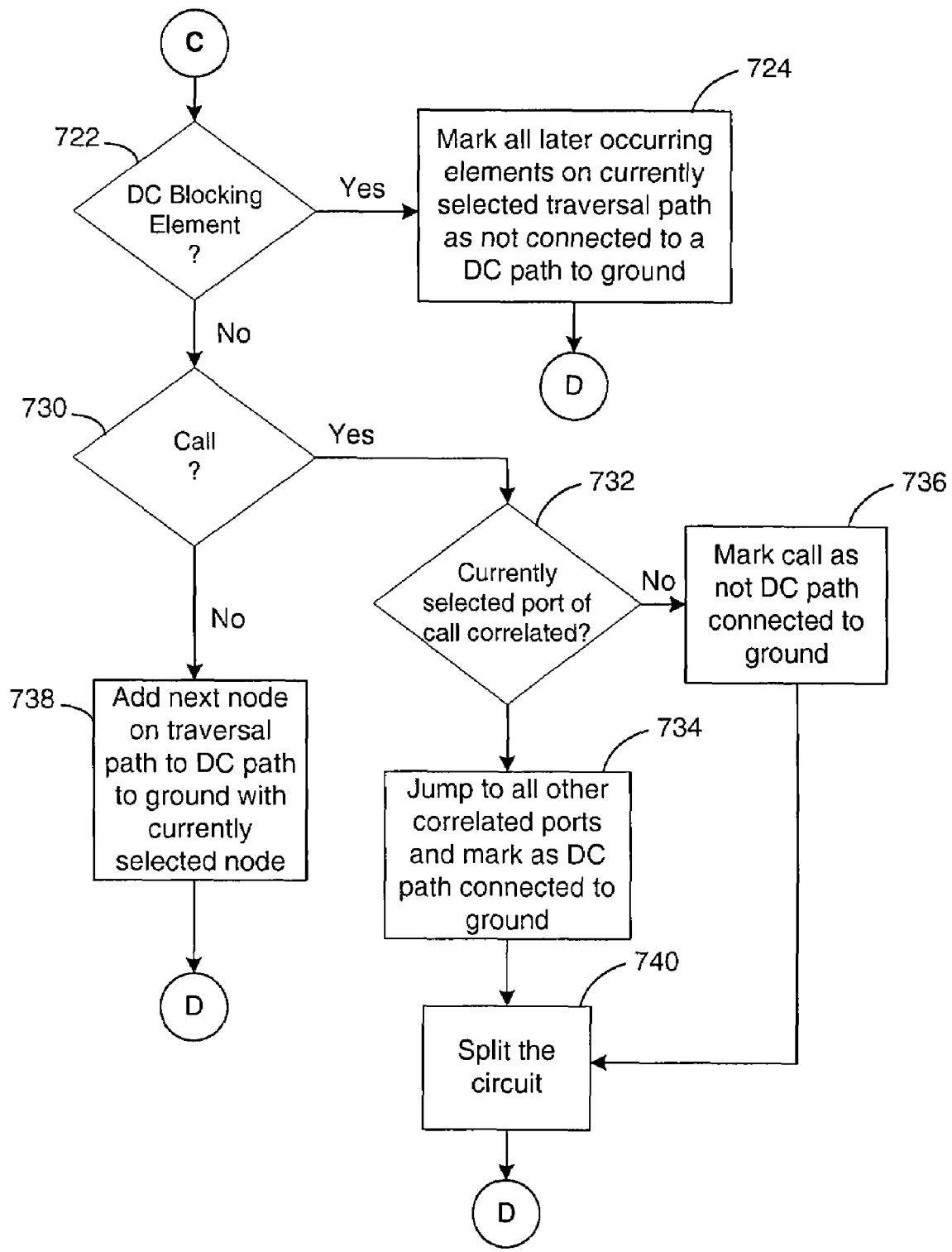

FIGS. 7A-7B provide an illustrative flow diagram representing a computer program controlled DC path to ground traversal process through a hierarchical circuit representation in accordance with an embodiment of the invention. It will be appreciated that the flow of FIGS. 7A-7B represents a computer program controlled process that can be used to program a general purpose computer to implement the DC path to ground traversal process. DC path to ground traversal starts at Step 712 by going to the top level of the circuit hierarchy. In decision Step 714, a determination is made as to whether there are untraversed nodes connected to a ground node or connected to a node that is connected to a higher level circuit component that itself is connected to a DC path to ground. If there are no unprocessed nodes at this current circuit hierarchy level, then in decision Step 716 a determination is made as to whether there are still lower levels of the circuit hierarchy that have not yet been traversed. If there are not, then the DC path to ground traversal process ends. If there are, then in Step 718 the traversal process goes down one level in the circuit hierarchy and proceeds back to Step 714 and continues the DC path to ground traversal at this next lower level.

If in Step 714 a determination is made that there do exist nodes that have not been traversed to determine whether there they are connected to a DC path to ground, then in Step 720 an untraversed node from the current level is selected for a traversal attempt. In decision Step 722 a determination is made as to whether there is a DC blocking element on the currently selected attempted traversal path. A blocking element may be a capacitor, for example. If in decision Step 723 a determination is made that the traversal is unsuccessful due to the presence of a blocking element, then in Step 724, all other circuit elements located on the blocked traversal path opposite the blocking circuit element are marked as floating. For example, a circuit component disposed on an opposite side of a capacitor from the currently selected node will be marked as floating. Circuit elements marked as floating are not part of a circuit path that has a DC connected to ground.

If, on the other hand, in decision 722 a determination is made that there is no DC blocking element in the attempted traversal path, then in decision step 730, a determination is made as to whether there is a call connected in the attempted traversal path. If decision step 730 determines that there is a call in the circuit path, then in decision step 732, a determination is made as to whether the port of the call that is connected to the path being traversed is a member of a DC port group for the call. If in decision Step 732 it is determined that the port of the call connected to the path is correlated to other ports of the call through membership in a DC port group, then in Step 734 the traversal process automatically jumps to each other port of the call that is a member of the DC port group. Thus, all such other ports are marked as connected to a circuit path that has DC connection to ground.

If in decision step 732, a determination is made that the selected node of the call incident upon the path under attempted traversal is not correlated to any other port through a DC port group, then in Step 736, the currently selected node is marked as not being connected to a DC path to ground.

In the course of step 734 or 736, assuming that one of these steps occurs, step 740 splits the circuit hierarchy database, to create in the circuit hierarchy a new instance of the call identified in the most recent iteration of step 730. The new call instance is associated with a DC port signature that indicates DC port connection to ground for at least one port of the new call instance. In one embodiment, the DC port signature serves as an identifier or reference to the new instance. For any given call, only one new instance is created for each DC port signature. The following table provides an example of a port signature for a hypothetical call having four ports.

| Port Signature for Hypothetical Call | |
|---|---|
| Port Name | DC connected to ground? 1 = yes, 0 = no |
| P1 | 1 |
| P2 | 0 |
| P3 | 1 |
| P4 | 0 |

Thus, the port signature for the above hypothetical new call instance is (1010), indicating that two ports are DC connected to ground and two ports are not DC connected to ground.

If in decision step 730, a determination is made that there is not a call in the attempted traversal path, then in step 738, the next nodes(s) in the path under attempted traversal are added to a DC path to ground with the currently selected node.

Following Step 724 or 738 or 740, whichever occurs, the traversal process returns to Step 714.

ILLUSTRATIVE EXAMPLE

Figure 8:
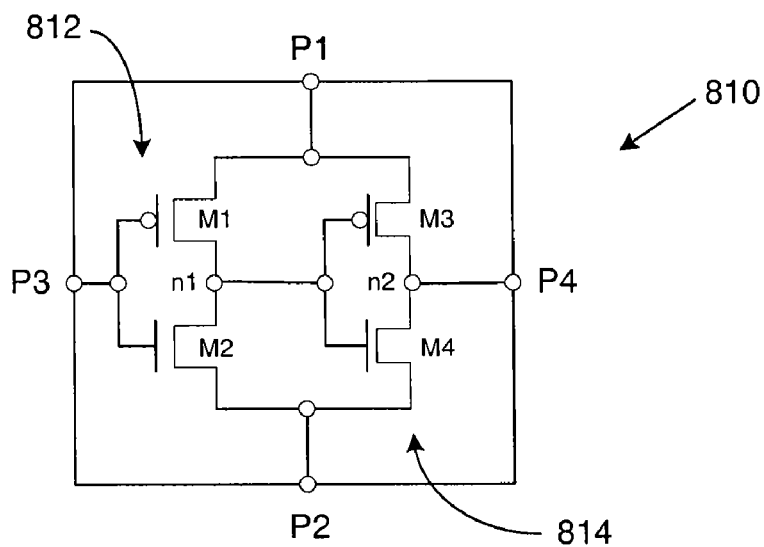
FIG. 8 is an illustrative drawing of a SPICE-like model of a hypothetical first leaf circuit used to explain an embodiment of the invention.

FIG. 8 is an illustrative drawing of a SPICE-like model of a hypothetical first leaf circuit 810 used to explain an embodiment of the invention. The first leaf circuit model 810 represents a pair of cascaded inverters 812, 814. A first inverter 812 includes MOSFETs M1, M2. A second inverter includes MOSFETs M3, M4. Each respective MOSFET includes a DC channel path between its respective source and drain. However, no DC channel path exists between any of the respective MOSFET gates and their respective source/drain channels. A first node n2 is disposed at the source/drain connection between M1 and M2. A second node n2 is disposed at the source/drain connection between M3 and M4. A conductive path 816 interconnects the first and second nodes, n1 and n2. The first leaf circuit model also includes four ports P1-P4 and two nodes n1-n2. As used herein, a port signifies a terminal or a pin. As set explained above, a node signifies a point of interconnection between branch paths among circuit elements.

During computer program controlled preprocessing, a DC path is identified between the first leaf circuit's ports P1 and P2 due to the DC channel paths of MOSFETs M1 and M2. Specifically, through DC path traversal attempts, a determination is made that there exists a DC path between P1 and node n1, via the M1 channel, and that there exists a DC path between n1 and P2, via the M2 channel. It will be appreciated that the DC path is bidirectional. Similarly, during preprocessing, a DC path is identified between port P1 and P2 due to the DC channel paths of MOSFETs M3 and M4. Specifically, there exists a DC path between P1 and node n2, via the M3 channel, and there exists a DC path between n2 and P2, via the M4 channel. Thus, a determination is made that the first leaf circuit's ports P1 and P2 are correlated ports.

Moreover, during computer program controlled preprocessing, a DC path is identified between the first leaf circuit's P1 and P4 and between the first leaf circuit's P2 and P4. More particularly, through DC path traversal attempts, a determination is made that there exists a DC path between the first leaf circuit's P1 and its node n2 and between n2 and P4. Likewise, a determination is made that there exists a DC path between the first leaf circuit's P2 and its node n2 and between n2 and P4. Thus, a determination is made that the first leaf circuit's ports P1 and P4 are correlated, and the first leaf circuit's ports P2 and P4 are correlated.

As mentioned above, a port group is a collection of ports that are correlated, such that there is a DC path between any two members of the group. For example, for the first leaf circuit 810, there are DC paths between ports P1 and P2 and between P1 and P4 and between P2 and P4. Therefore, the first leaf circuit's ports P1, P2 and P4 are correlated. Preprocessing identifies and records these three ports as members of the same port group relative to the first leaf circuit 810. The first leaf circuit's port P3 is not correlated, which means that there is no DC path from that port to any other port in the first leaf circuit 810. Basically, P3 is connected to the gates of MOSFETs M1 and M2, and there is no DC path from either of those two gates to any other port of the first leaf circuit 810. As will be apparent from the illustrative description below, grouping correlated ports of the first leaf circuit 810 into port groups can speed and simplify DC path to ground identification by obviating the need to repeatedly traverse instances of the first leaf circuit 810 to identify DC paths during the DC path to ground traversal process.

Figure 9:
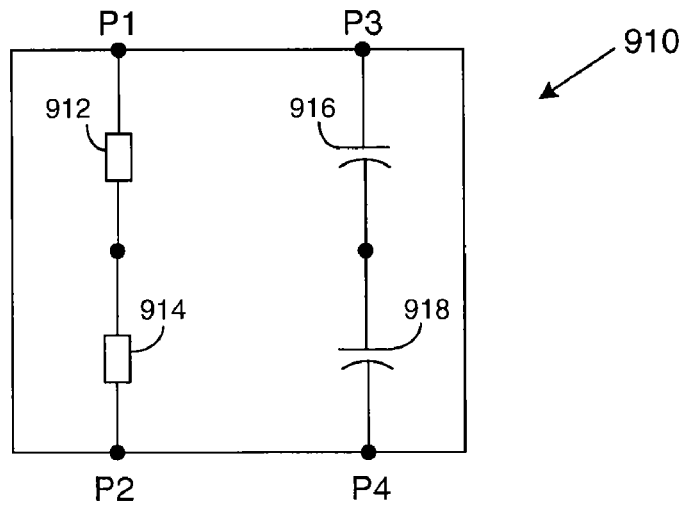
FIG. 9 is an illustrative SPICE-like model of a hypothetical second leaf circuit used to explain an embodiment of the invention.

FIG. 9 is an illustrative SPICE-like model of a hypothetical second leaf circuit 910 used to explain an embodiment of the invention. In the example, the second leaf circuit model 910 is at the same lower level of the overall circuit hierarchy as the first leaf circuit model 810. The second leaf circuit model 910 represents a pair of resistors 912, 914 and a pair of capacitors 916, 918. The second leaf circuit includes a four ports P1-P4 and two nodes n1, n2. A first resistor 912 is connected between port P1 and node n1. A second resistor 914 is connected between port P2 and n1. A first capacitor 916 is connected between port P3 and node n2. A second capacitor 918 is connected between port P4 and n2.

During computer program controlled preprocessing, a DC path is identified between the second leaf circuit's P1 and P2. That is, there is a DC path between ports P1 and P2 via resistors 912 and 914. Thus, the second leaf circuit's ports P1, P2 are correlated. During preprocessing, a DC path is identified between P3 and P4. The capacitors 916, 918 preclude a DC path between P3 and P4. Thus, the second leaf circuit's ports P3, P4 are uncorrelated. Therefore, preprocessing identifies and records P1 and P2 as members of the same DC port group relative to the second leaf circuit 910.

Figure 10:
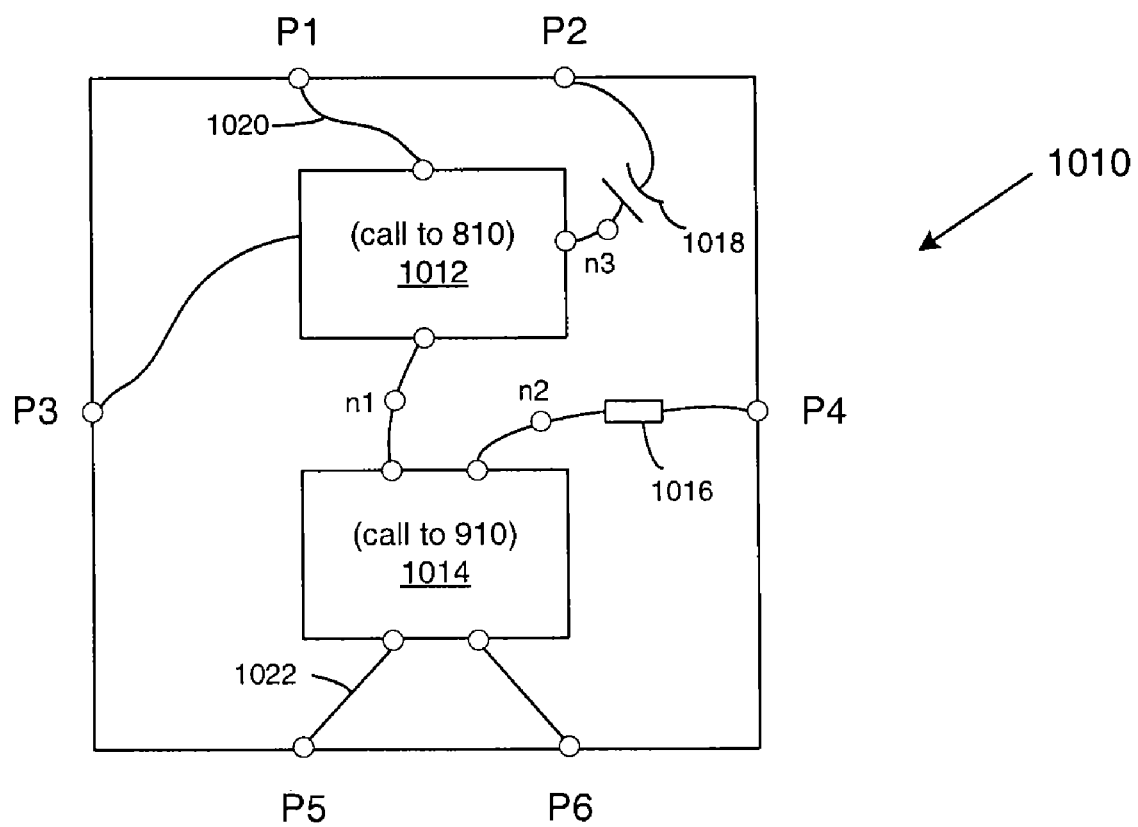
FIG. 10 is an illustrative SPICE-like model of a hypothetical branch circuit used to explain an embodiment of the invention.

FIG. 10 is an illustrative SPICE-like model of a hypothetical branch circuit 1010 used to explain an embodiment of the invention. In this example, branch circuit 1010 is at a next higher level in the circuit hierarchy above the first and second leaf circuits 810, 910. Thus, in accordance with one embodiment, branch circuit 1010 is preprocessed after the preprocessing of the first and second leaf circuits 810, 910. Also, port group membership determinations derived during preprocessing of the first and second leaf circuits 810, 910 are used during preprocessing of the branch circuit 1010.

The branch circuit model 1010 includes two calls 1012, 1014. A first call 1012 is to an instance of the first leaf circuit model 810 illustrated in FIG. 8. A second call 1014 is to an instance of the second leaf circuit model 910 illustrated in FIG. 9. The branch circuit model 1010 also includes a resistor 1016 and a capacitor 1018 as shown. The branch circuit model 1010 also includes four ports P1-P4 and two nodes n1-n3 as shown.

Components of the branch circuit model 1010 are interconnected as follows. Branch circuit model port P1 is connected to port P1 of the call 1012 to the first leaf circuit 810. Branch circuit capacitor 1018 is connected between port P2 of the branch circuit model 1010 and P4 of the call 1014 to the first leaf circuit model 810. Branch circuit node n3 is on a conductor path between port P4 of the call 1012 to the first leaf circuit model 810 and branch circuit capacitor 1018. Branch circuit model P3 is connected to P3 of the call 1012 to the first leaf circuit model 810. Branch circuit resistor 1016 is connected between P4 of the branch circuit model and port P3 of the call 1014 to the second leaf circuit 910. Branch circuit node n2 is on a branch path between the P3 of the call 1014 to the second leaf circuit 910 and resistor 1016 of the branch circuit 1010. Branch circuit port P5 is connected to P2 of the call 1014 to the second leaf circuit 910. Branch circuit port P6 is connected to P4 of the call 1014 to the second leaf circuit 910. Also, P1 of the call 1014 to the second leaf circuit 910 is connected to P2 of the call 1012 to the first leaf circuit 810.

During preprocessing, a determination is made that branch circuit ports-P1 and P5 of the branch circuit 1010 are correlated, and therefore, are members of the same DC port group relative to the branch circuit 1010. More specifically, through traversal of branch path 1020 within the branch circuit model 1010, a determination is made that there is a DC path between P1 of the branch circuit 1010 and P1 of the call 1012 to the first leaf circuit model 810. Since, ports of P1 and P2 of the first leaf circuit model 810 were identified during preprocessing as being correlated, i.e., members of the same port group, an automatic determination is made that there is a DC path between P1 and P2 of the call 1014 to the first leaf circuit 810. The use of port group information derived during the preprocessing stage to make this determination obviates the need to step down to a lower level of the hierarchy during this preprocessing stage to evaluate DC paths within the first leaf circuit model 810.

Based on a branch path through n1 of the branch circuit 1010, a determination is made that there is a DC path between P2 of the call 1012 to the first leaf circuit model 810 and P1 of the call 1014 to the second leaf circuit model 910. Based upon the correlation between P1 and P2 of the call 1014 to the second leaf circuit model 910, a further determination is made automatically that there is a DC path between P1 and P2 of the call 1014 to the second leaf circuit model 910. Again, note that this determination is made based upon preprocessing information without the need to step down in the hierarchy during this traversal stage to evaluate DC paths within the second leaf circuit model 910. Based upon path 1022 in the branch circuit model 1010, a determination is made that there is a DC path between P2 of the call 1014 to the second leaf circuit model 910 and port P5 of the branch circuit model 1010. Thus, there is a DC path between P1 and P5 of the branch circuit model 1010. It happens that in this example, a DC path traverses two different calls, the call 1012 to the first leaf circuit 810 and call 1014 to the second leaf circuit 910. Accordingly, ports P1 and P5 of the branch circuit are correlated, and are members of the same DC port group relative to the branch circuit 1010.

Also during computer program controlled preprocessing, a determination is made that branch circuit ports P2, P3, P4 and P6 of branch circuit 1010 are uncorrelated. As to port P2 of the branch circuit 1010, capacitor 1018 of the branch circuit 1010 precludes a DC path between that P2 and any other port of the branch circuit 1010. As to port P3 of the branch circuit 1010, a lack of correlation of port P3 of the call 1012 to the first leaf circuit 810 with any other port of the first leaf circuit 810 indicates that P3 of the branch circuit 1010 is uncorrelated. This determination is made automatically based upon DC port group information developed about the first leaf circuit 810 during preprocessing, which obviates the need to step down into the hierarchy during this traversal stage to ascertain whether port P3 of the first leaf circuit 810 is correlated to any other port of the first leaf circuit 810.

As to port P4, of the branch circuit 1010, a lack of correlation of port P3 of the call 1014 to the second leaf circuit 910 with any other port of the call 1014 to the second leaf circuit 910 indicates that P4 of the branch circuit 1010 is uncorrelated. As to port P6, of the branch circuit 1010, a lack of correlation of port P4 of the call 1014 to the second leaf circuit 910 with any other port of the call 1014 to the second leaf circuit 910 indicates that P6 of the branch circuit 1010 is uncorrelated. The determinations about P4 and P6 of the branch circuit 1010 are made automatically based upon DC port group information developed about the second leaf circuit 910 during preprocessing, which obviates the need to step down into the hierarchy during this traversal stage to ascertain whether ports P3 or P4 of the second leaf circuit 910 are correlated to any other port of the second leaf circuit 910.

Figure 11:
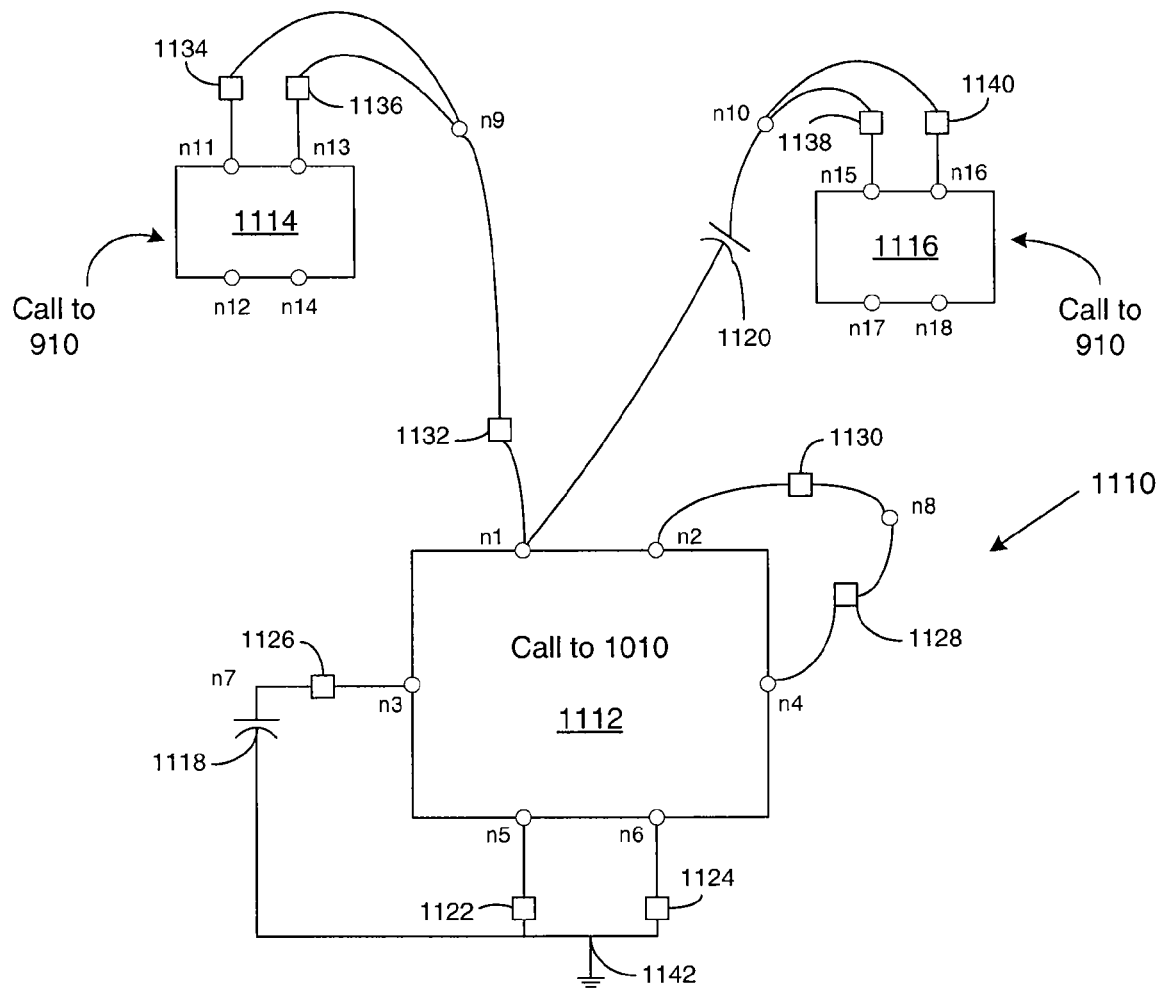
FIG. 11 is an illustrative drawing of a SPICE-like model of a hypothetical root circuit used to explain an embodiment of the invention.

FIG. 11 is an illustrative drawing of a SPICE-like model of a hypothetical root circuit 1110 used to explain an embodiment of the invention. The root circuit model 1110 includes a call 1112 to an instance of the branch circuit 1010 of FIG. 10 and includes calls 1014, 1016 to two instances of the second leaf circuit 910 of FIG. 9. The root circuit model 1110 also includes multiple capacitors 1118, 1120, a plurality of resistors 1122-1136, a plurality of nodes n15-n18 and a ground node 1142, connected as shown. More specifically, nodes n1-n6 of the root circuit model 1110 are respectively connected to ports P1-P5 of the call 1112 to the branch circuit model 1010. Nodes n11-n14 of the root circuit model are respectively connected to ports P1-P4 of a first call 1114 to the second leaf circuit model 910. Nodes n15-n18 of the root circuit model 1110 are respectively connected to ports P1-P4 of a second call 1116 to the second leaf circuit model 910.

In accordance with one embodiment of the invention, a computer program controlled DC path to ground traversal downward through the circuit hierarchy in search of DC paths to ground is performed once preprocessing has been completed. In one embodiment, the traversal proceeds downward from the top of the hierarchy and progresses level-by-level through the hierarchy in a breadth first manner, at each level. Moreover, at each level of a circuit hierarchy, the traversal in search of DC paths to ground may begin at each port at that level determined to be connected to a DC path to a designated reference value, which typically is ground potential. Thus, a top down traversal may spawn multiple parallel top down traversals, each starting, or branching, from different starting locations within one or more levels of a circuit hierarchy.

In this example, the DC path traversal starts at ground node 1142. A DC path to ground is identified between ground node 1142 and node n1 of the root circuit model 1110. The DC traversal process, also traverses a DC circuit path from ground node 1142 across resistor 1124 to node n6. Due to the presence of capacitor 1118, the DC traversal process is unable to traverse a DC path from ground node 1142 to node n3. Nodes n5, n6 and n1 of root circuit 1110 are associated with ports P1, P5 and P6 of call 1112 to branch circuit 1010. The DC traversal path uses the DC port group information developed for root circuit 1010 to determine that ports P1 and P5 of branch circuit 1010 are correlated and that ports P2, P3, P4 and P6 are not correlated. Based on this information, the DC path traversal process determines that nodes n1, n5 and n6 of the root circuit 1110 are DC path connected to ground, and that nodes n2, n3 and n4 of the branch circuit 1110 are not DC path connected to ground. The DC path traversal process also determines that ports P1, P5 and P6 of call 1112 to root circuit 1010 are connected to a DC path to ground, and that ports P2, P3 and P4 are not connected to a DC path to ground. The DC path to ground traversal process marks ports P1, P5 and P6 of call 1112 to branch circuit 1010 as connected to a DC path to ground, and marks ports P2, P3 and P4 of the call as not connected to a DC path to ground. There is no need to step down again into the branch circuit model 1010 to ascertain this internal DC path, since a determination was made during preprocessing.

An absence of DC paths to ground is identified during the top down DC path to ground traversal with respect to nodes n2, n3, n4 and n6 of the root circuit 1110. Specifically, for example, during the traversal at this same level, a determination is made that there is no DC path between ground node 1142 and n3 of the root circuit due to the presence of capacitor 1118. A determination also is made that there is no DC path between ground node 1142 and either n2 or n4 of the root circuit 1110. These two nodes n2 and n4 are respectively connected to nodes uncorrelated ports P2 and P4 of the call 1112 to the branch circuit 1010. These two nodes, n2 and n4, also are connected to each other through resistors 1128 and 1130. However, neither nodes n2 nor n4 has a DC path connection to the ground terminal 1142. Moreover, node n6 of the root circuit 1110 has no associated DC path. Although this node n6 is connected with the ground terminal 1142, it also is connected to uncorrelated port P6 of the call 1112 to the branch circuit 1010. Thus, n6 of the root circuit 1110 is not part of a DC path. Note that the DC path determinations as to n2, n4 and n6 were made, at least in part, based upon information about uncorrelated ports developed during preprocessing. Thus, there was no need to step down into the branch circuit 1010 to determine whether or not there were internal DC paths between these ports.

During the DC path to ground traversal, a determination is made that nodes n11 and n12 of the root circuit 1110 are part of a DC path to ground, but nodes n13 and n14 of the root circuit 1110 are not part of a DC path. Also, during the DC path to ground traversal, a determination is made that none of nodes n15-n18 of the root circuit 1110 is part of a DC path to ground. Basically, capacitor 1120 isolates nodes n15-n18 from node n1 of the root circuit 1110, which itself, is on a DC path. However, nodes n11 and n13 of the root circuit 1110 are connected with n1 of the root circuit 1110 via resistors. In particular, nodes n11 and n13 of the root circuit 1110 are on a DC path to ground because they are connected to n1 of the root circuit 1110 via resistors 1132, 1134 and 1132, 1136, respectively. Hence, these nodes n11 and n13 are determined to be on a DC path to ground.

Nodes n11 and n13 of the root circuit 1110 are respectively connected to ports P1 and P3 of a first call 1112 to of the second leaf circuit 910. Nodes n12 and n14 of the root circuit 1110 are respectively connected to ports P2 and P4 of the first call to the second leaf circuit 910. As explained above, P1 and P2 of the second leaf circuit 910 are correlated; they are members of the same DC port group. Thus, nodes n11, n12 and n13 of the root circuit are determined to be on a DC path to ground and are marked as such. Ports P3 and P4 of the second leaf circuit 910 are uncorrelated. Thus, node n14 of the root circuit is determined to not be on a DC path to ground and is marked as such.

Figure 12:
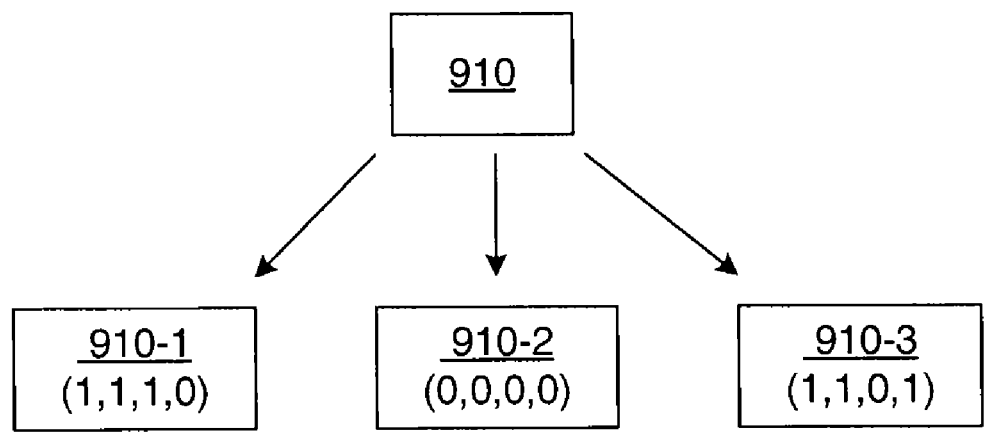
FIG. 12 is an illustrative drawing showing in conceptual terms, a splitting of the circuit hierarchy structure to include new instances of the second leaf circuit.

FIG. 12 is an illustrative drawing showing in conceptual terms, a splitting of the circuit hierarchy structure to include additional instances of the second leaf circuit 910. More particularly, based on the traversal of nodes n11, n12, n13 and n14, of root circuit 1110, which are associated with ports P1, P2, P3 and P4 of call DD 14 to the second leaf circuit 910, the DC path traversal process determines that call 1114 has the following DC port signature: (1,1,1,0,), where 1 signifies a DC path connected to ground, and 0 signifies that there is no DC path connected to ground. Furthermore, based on the traversal of nodes n15, n16, n17 and n18 of root circuit 1110, which are associated with ports P1, P2, P3 and P4 of call DD 16 to the second leaf circuit 910, the DC path traversal process determines that call 1116 has the following DC port signature: (0,0,0,0,). Consequently, the DC traversal process splits the portion of the circuit hierarchy representing leaf circuit 910, to include a first new instance of the second leaf circuit 910-1 corresponding to port signature (1,1,1,0) and to include a second new instance of the second leaf circuit 910-2 corresponding to port signature (0,0,0,0). These two corresponding port signatures are used subsequently by the DC traversal process to reference these two new instances of the second leaf circuit 910-1 and 910-2 in the circuit design hierarchy.

Figure 13:
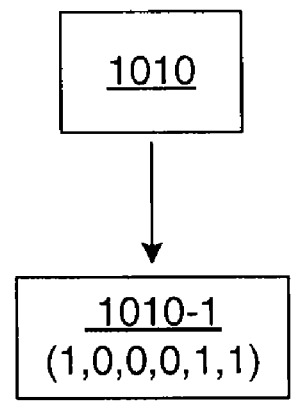
FIG. 13 is an illustrative drawing showing in conceptual terms, a splitting of the circuit hierarchy structure to include a new additional instance of the branch circuit.

FIG. 13 is an illustrative drawing showing in conceptual terms, a splitting of the circuit hierarchy structure to include additional instances of the branch circuit 1010. As explained above, based on the traversal of nodes n1, n2, n3, n4, n5 and n6, of root circuit 1110, which are associated with ports P1, P2, P3, P4, P5 and P6 of call 1112 to the branch circuit 1010, the DC path traversal process determines that call 1112 has the following DC port signature: (1,0,0,0,1,1). Consequently, the DC traversal process splits the portion of the circuit hierarchy representing branch circuit 1010, to include a first new instance of the branch leaf circuit 1010-1 corresponding to port signature (1,0,0,0,1,1). This corresponding port signature is used subsequently by the DC traversal process to reference this new instance of the root circuit 1010-1 in the circuit design hierarchy.

When the nodes of the root level of the hierarchy have been traversed, the DC path to ground circuit traversal process, there is a step down into a next lower level of the circuit hierarchy, the branch circuit level in this example. In a current embodiment, the DC path to ground traversal progresses within each level in a breadth first manner. Thus, at this next level, the traversal starts from each ground node at that next level, if there are any, and from each circuit element marked as being connected to a DC path to ground within a previously traversed higher level circuit element. In this example, the next level traversal would proceed by pushing inside of branch circuit call 1112, since ports P1, P5 and P6 of call 1112 were identified and marked by the DC path to ground traversal process as being part of a DC path to ground. Specifically, the DC path traversal process continues the DC path traversal at each of these marked ports P1, P5 and P6 within the first instance of the branch circuit 1010-1 corresponding to port signature (1,0,0,0,1,1).

Figure 14:
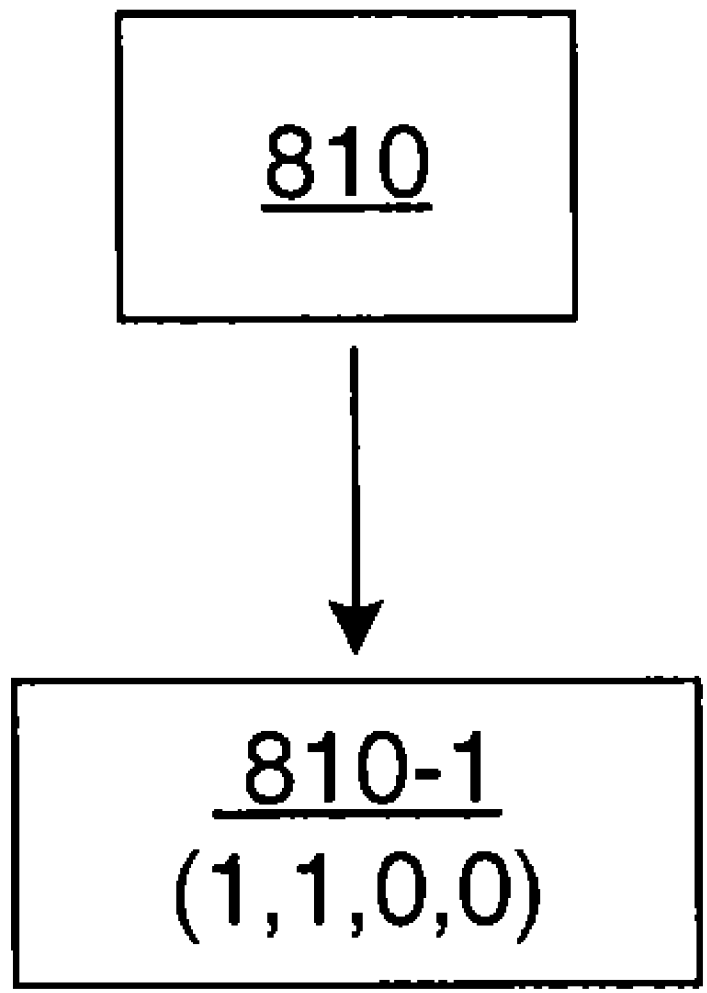
FIG. 14 is an illustrative drawing showing in conceptual terms, a splitting of the circuit hierarchy structure to include a new additional instance of the first leaf circuit.

In pushing in to the branch level circuit instance 1010-1, the DC traversal process visits nodes n1, n2 and n3 to determine which, if any, are connected to a DC path to ground. In the course of the branch level traversal, the process determines that port P1 of branch 1010 is connected to port P1 of call 1012 to first leaf circuit 810. The DC path traversal process uses DC port group information developed during preprocessing, to determine that ports P1 and P2 of the call 1012 to the first leaf circuit 810 are correlated and that ports P3 and P4 of that call 1012 are not correlated. Hence, the DC path to ground traversal process marks ports P1 and P2 of the call 1012 as DC path connected to ground and marks ports P3 and P4 of that call as not DC path connected to ground. The call 1012 to the first leaf circuit 810, therefore, is determined to have a port signature (1,1,0,0), and as shown in FIG. 14, a new first instance of the first leaf circuit 810-1 is produced that corresponds to port signature (1,1,0,0).

Also, in pushing in to the branch level circuit instance 1010-1, the DC traversal process determines that ports P5 and P6 of branch circuit 1010 are connected to port P2 and P4 of call 1014 to second leaf circuit 910. The DC path traversal process uses DC port group information developed during preprocessing, to determine that port P2 of the call 1014 to the second leaf circuit 910 is correlated to port P1 of the second leaf circuit 910. The DC path traversal process also uses DC port group information developed during preprocessing, to determine that port P4 of the call 1014 to the second leaf circuit 910 is not correlated to port P3 of the second leaf circuit 910. Thus, the DC path to ground traversal process marks ports P1, P2 and P4 of the call 1014, as DC path connected to ground and marks port P3 as not DC path connected to ground. The call 1014 to the second leaf circuit 910, therefore, is determined to have a port signature (1,1,0,1), and as shown in FIG. 12.

When the nodes at the branch level of the hierarchy have been traversed, the DC path to ground circuit traversal process, there is a step down into a next lower level of the circuit hierarchy, the leaf circuit level in this example. As mentioned above, in a current embodiment, the DC path to ground traversal progresses within each level in a breadth first manner. Thus, at this next level, the traversal starts from each ground node at that next level, if there are any, and from each circuit element marked as being connected to a DC path to ground within a previously traversed higher level circuit element.

In this example, the DC path to ground traversal process needs to traverse each of the three new instances of the second leaf circuit 910-1, 910-2 and 910-3 having respective port signatures, (1,1,1,0), (0,0,0,0) and (1,1,0,1), and the single new instance of the first leaf circuit 810-1 having a port signature (1,1,0,0). The DC path traversal process traverses the nodes of each of these four leaf level circuit instances. For each respective leaf circuit instance, a respective traversal progresses from each port of the respective instance determined to be connected to a DC path to ground. More specifically, for example, for the first instance of the second leaf circuit 910-1, the traversal begins at ports P1, P2 and P3. For the second instance of the second leaf circuit 910-2, there is no need for a traversal since no port is connected to a DC path to ground. Thus, all nodes of the second instance of the second leaf circuit 910-1 are determined to be not DC path connected to ground. For the third instance of the second leaf circuit 910-3, the DC path traversal proceeds from ports P1, P2 and P4. For the first instance of the first leaf circuit, the DC path traversal proceeds from ports P1 and P2.

Thus, each different new instance of each leaf circuit can be separately traversed without the need to disrupt the circuit design hierarchy. Specifically, each new instance is disposed in the hierarchy at the same location in the hierarchy where its original instantiation was located. Referring to FIG. 12, for example, each of the first, second and third new instances of the second leaf circuit, 910-1, 910-2 and 910-3 is disposed in the hierarchy where the original instantiation of the second leaf circuit 910 was disposed. However, each separate respective new instance can be referenced separately and can be traversed separately using its respective DC port signature.

Furthermore, the DC path to ground traversal process is made more efficient through the use of DC port group information, which can obviate the need to step down into a call to a lower level of the hierarchy and traverse DC path connections within the call. The DC port group information readily provides DC path connection information for the ports of the call thereby avoiding the need to actually traverse the call to determine the DC path connectivity among ports within the call.

Figure 15:
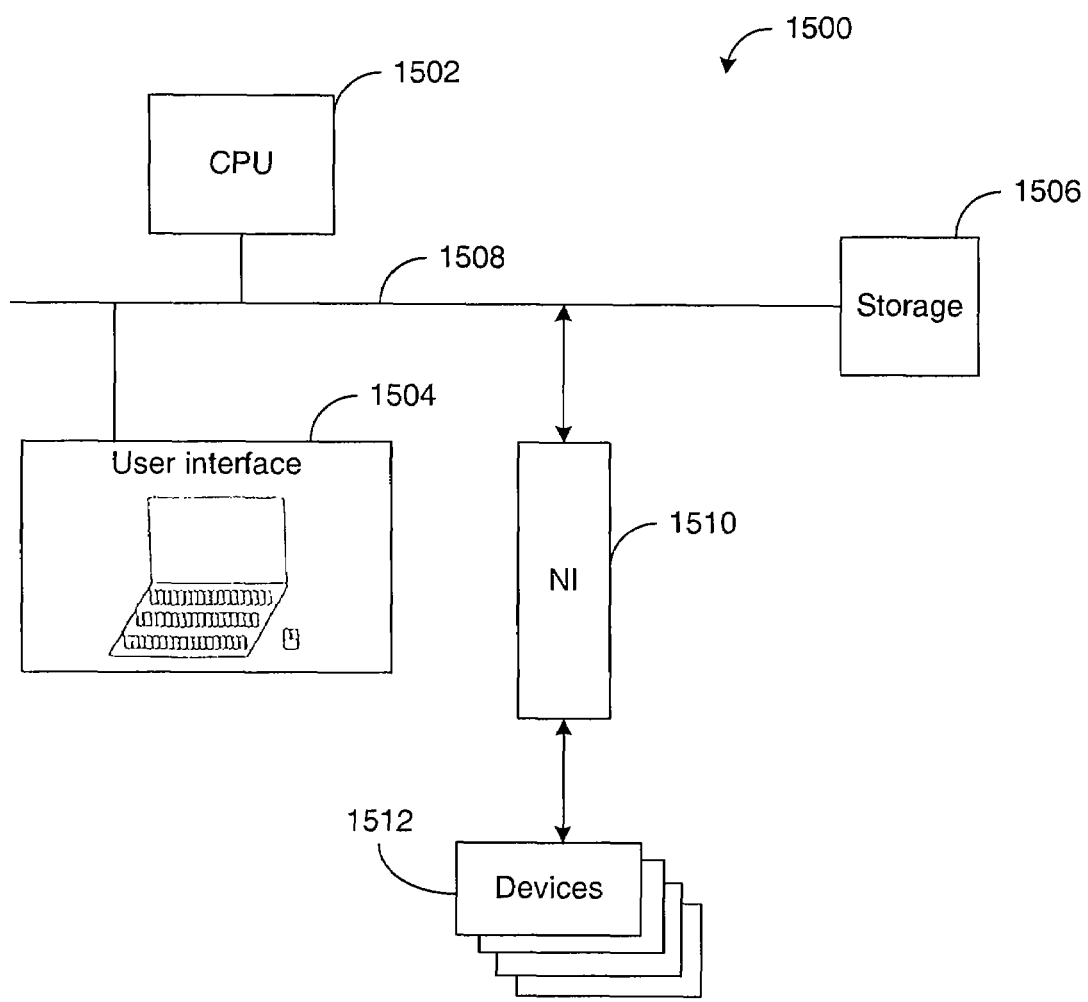
FIG. 15 is a schematic drawing of an illustrative computer system that can be programmed to run a preprocessing process and/or to run a DC path to ground traversal process in accordance with embodiments of the invention.

FIG. 15 is a schematic drawing of an illustrative computer system 1500 that can be programmed to run a preprocessing process and/or to run a DC path to ground traversal process in accordance with embodiments of the invention. The computer system 1500 includes one or more central processing units (CPU's) 1502, a user interface 1504, computer readable storage media 1506, a system bus 1508, and one or more bus interfaces for connecting the CPU, user interface, memory and system bus together. The illustrative computer system also includes a network interface 1510 for communicating with other devices 1512 on a computer network.

A computer readable hierarchical representation of a circuit design, such as that explained with reference to FIGS. 8-14, may be stored in the storage media 1506. The computer system 1500 may be programmed to preprocess of the hierarchical circuit design representation in accordance with an aspect of the invention. The computer system 1500 also may be programmed to conduct a DC path traversal of the hierarchical circuit design representation in accordance with another aspect of the invention. Specifically, for example, the computer readable hierarchical models of circuit design representations may be accessible, via bus 1508, from interface 1504, storage media 1508 or other devices 1512, to a preprocessing program of the embodiment of FIGS. 6A-6B and/or to a DC path traversal program of the embodiment of FIGS. 7A-7B that runs on the CPU 1502.

While the invention has been described herein with reference to various illustrative features, aspects and embodiments, it will be appreciated that the invention is susceptible of variations, modifications and other embodiments, other than those specifically shown and described. The invention is therefore to be broadly interpreted and construed as including all such alternative variations, modifications and other embodiments within its spirit and scope as hereinafter claimed.

What is claimed is:

1. A computer implemented method for evaluating a hierarchical representation of a circuit design encoded in a computer readable medium comprising:
    traversing at least a portion of a higher level circuit in the design that includes a reference potential connection to identify a port of a call to a first lower level circuit that is DC path connected to the reference potential;
    determining a DC port signature for a call to the first lower level circuit in the design identified as having a port DC connected to reference potential;
    producing a new instance of the first lower level circuit in the design that corresponds to the DC port signature and that represents the call to the first lower level circuit having the identified port; and
    traversing at least a portion of the new instance of the first lower level circuit to identify at least a portion of the first lower level circuit that is DC path connected to the port of the new instance of the first lower level circuit that is identified as DC path connected to the reference potential.

2. The computer implemented method of claim 1,
    wherein traversing at least a portion of the new instance of the first lower level circuit includes traversing at least a portion of the new instance to identify one or both of a first lower level circuit node or a port of a second lower level circuit that is DC path connected to the port of the new instance that is identified as DC path connected to the reference potential.

3. The computer implemented method of claim 1,
    wherein traversing at least a portion of the new instance of the first lower level circuit includes traversing at least a portion of the new instance of the first lower level circuit to identify a port of a second lower level circuit that is DC path connected to the port of the new instance of the first lower level circuit that is DC path connected to the reference potential; and further including:
    determining a respective DC port signature for a call to a second lower level circuit identified as DC path connected to the port of the new instance of the first lower level circuit that is DC path connected to the reference potential;

producing a new instance of the second lower level circuit that corresponds to the a port signature and that represents the call to the second lower level circuit having the identified port that is DC connected to the reference potential; and traversing at least a portion of the new instance of the second lower level circuit to identify a circuit path of the new instance of the second lower level circuit that is DC path connected to the port of the new instance of the second lower level circuit that is identified as DC path connected to the reference potential.

4. A computer implemented method for use in evaluating a hierarchical representation of a circuit design encoded in a computer readable medium comprising:

traversing at least a portion of a higher level circuit in the design that includes a reference potential connection to determine whether one or both of a port of a call to a first lower level circuit in the design that is DC path connected to the reference potential or a port of a call to a second lower level circuit in the design that is DC path connected to the reference potential;

traversing at least a portion of the first lower level circuit to determine whether a port of a call to a second lower level circuit that is DC path connected to a port of a call to the first lower level circuit that is identified as DC path connected to the reference potential;

identifying a DC port signature for a call to the second lower level circuit determined to have a port that is DC path connected to the reference potential;

producing a new instance of the second lower level circuit in the design that corresponds to the a port signature and that represents the call to the second lower level circuit having the port determined to be DC connected to the reference potential;

traversing at least a portion of the new instance of the second lower level circuit to determine whether there is a circuit path within the new instance of the second lower level circuit that is DC path connected to the port of the new instance of the second lower level circuit that is DC path connected to the reference potential.

5. A computer implemented method for evaluating a hierarchical representation of a circuit design encoded in a computer readable medium comprising:

traversing at least a portion of a higher level circuit in the design that includes a reference potential connection to identify one or both of a port of a call to a first lower level circuit in the design that is DC path connected to the reference potential or a port of a call to a second lower level circuit in the design that is DC path connected to the reference potential;

traversing at least a portion of the first lower level circuit to identify one or more calls to the second lower level circuit and to identify one or more ports of such one or more calls to the second lower level circuit that is DC path connected the reference potential;

determining a respective DC port signature for each identified call to the second lower level circuit;

producing a respective new instance of the second lower level circuit to represent each respective different occurrence of the second lower level circuit having a different respective DC port signature;

respectively traversing at least a portion of each respective new instance of the second lower level circuit that has at least one port DC connected to the reference potential, to determine whether a respective circuit path within such respective new instance is DC path connected to the at least one port of the such respective new instance that is DC path connected to the reference potential.

6. A computer implemented method for evaluating a hierarchical representation of a circuit design encoded in a computer readable medium comprising:

traversing at least a portion of a higher level circuit that includes a reference potential connection to identify a port of a call to a first lower level circuit that is DC path connected to the reference potential;

identifying a first DC port group that includes each one or more ports of the call to the first lower level circuit that is DC path connected to the identified port of the call to the first lower level circuit;

automatically marking as DC path connected to the reference potential, the one or more ports of the first DC port group that includes the identified port of the call to the first lower level circuit; and determining a DC port signature for the call to the first lower level circuit having the identified port DC connected to the reference potential;

wherein the DC port signature identifies at least the port of such call to the first lower level circuit that is DC path connected to the reference potential;

producing a new instance of the first lower level circuit that corresponds to the DC port signature and that represents the call to the first lower level circuit having the identified port; and traversing at least a portion of the respective new instance of the first lower level circuit to identify a circuit path within the new instance that is DC path connected to the port of the new instance that is DC path connected to the reference potential.

7. An article of manufacture that includes computer readable medium encoded with computer program code for use in evaluating a hierarchical representation of a circuit according to a method comprising:

traversing at least a portion of a higher level circuit that includes a reference potential connection, to identify a port of a call to a first lower level circuit that is DC path connected to the reference potential;

identifying a first DC port group that includes each port of the call to the first lower level circuit that is DC path connected to the identified port of the call to the first lower level circuit;

automatically marking as DC path connected to the reference potential, each port of the call to the first lower level circuit that is a member of the first DC port group; and traversing at least a portion of the first lower level circuit to identify a circuit path within the first lower level circuit that is DC path connected to a marked port of the first lower level circuit.

8. A system for use in evaluating a hierarchical representation of a circuit design encoded in a computer readable medium comprising:

means for traversing at least a portion of a higher level circuit that includes a reference potential connection, to identify a port of a call to a first lower level circuit that is DC path connected to the reference potential;

means for identifying a first DC port group that includes each port of the call to the first lower level circuit that is DC path connected to the identified port of the call to the first lower level circuit;

means for automatically marking as DC path connected to the reference potential, each port of the call to the first lower level circuit that is a member of the first DC port group; and means for traversing at least a portion of the first lower level circuit to identify a circuit path within the first lower level circuit that is DC path connected to a marked port of the first lower level circuit.

9. An article of manufacture that includes computer readable medium encoded with computer program code for use in evaluating a hierarchical representation of a circuit according to a method comprising:

traversing at least a portion of a higher level circuit in the design that includes a reference potential connection to identify a port of a call to a first lower level circuit that is DC path connected to the reference potential;

determining a DC port signature for a call to the first lower level circuit in the design identified as having a port DC connected to reference potential;

producing a new instance of the first lower level circuit in the design that corresponds to the DC port signature and that represents the call to the first lower level circuit having the identified port; and traversing at least a portion of the new instance of the first lower level circuit to identify at least a portion of the first lower level circuit that is DC path connected to the port of the new instance of the first lower level circuit that is identified as DC path connected to the reference potential.

10. A system for use in evaluating a hierarchical representation of a circuit according to a method comprising:

means for traversing at least a portion of a higher level circuit in the design that includes a reference potential connection to identify a port of a call to a first lower level circuit that is DC path connected to the reference potential;

means for determining a DC port signature for a call to the first lower level circuit in the design identified as having a port DC connected to reference potential;

means for producing a new instance of the first lower level circuit in the design that corresponds to the DC port signature and that represents the call to the first lower level circuit having the identified port; and means for traversing at least a portion of the new instance of the first lower level circuit to identify at least a portion of the first lower level circuit that is DC path connected to the port of the new instance of the first lower level circuit that is identified as DC path connected to the reference potential.

11. An article of manufacture that includes computer readable medium encoded with computer program code for use in evaluating a hierarchical representation of a circuit according to a method comprising:

traversing at least a portion of a higher level circuit in the design that includes a reference potential connection to determine whether one or both of a port of a call to a first lower level circuit in the design that is DC path connected to the reference potential or a port of a call to a second lower level circuit in the design that is DC path connected to the reference potential;

traversing at least a portion of the first lower level circuit to determine whether a port of a call to a second lower level circuit that is DC path connected to a port of a call to the first lower level circuit that is identified as DC path connected to the reference potential;

identifying a DC port signature for a call to the second lower level circuit determined to have a port that is DC path connected to the reference potential;

producing a new instance of the second lower level circuit in the design that corresponds to the a port signature and that represents the call to the second lower level circuit having the port determined to be DC connected to the reference potential;

traversing at least a portion of the new instance of the second lower level circuit to determine whether there is a circuit path within the new instance of the second lower level circuit that is DC path connected to the port of the new instance of the second lower level circuit that is DC path connected to the reference potential.

12. A system for use in evaluating a hierarchical representation of a circuit according to a method comprising:

means for traversing at least a portion of a higher level circuit in the design that includes a reference potential connection to determine whether one or both of a port of a call to a first lower level circuit in the design that is DC path connected to the reference potential or a port of a call to a second lower level circuit in the design that is DC path connected to the reference potential;

means for traversing at least a portion of the first lower level circuit to determine whether a port of a call to a second lower level circuit that is DC path connected to a port of a call to the first lower level circuit that is identified as DC path connected to the reference potential;

means for identifying a DC port signature for a call to the second lower level circuit determined to have a port that is DC path connected to the reference potential;

means for producing a new instance of the second lower level circuit in the design that corresponds to the a port signature and that represents the call to the second lower level circuit having the port determined to be DC connected to the reference potential;

means for traversing at least a portion of the new instance of the second lower level circuit to determine whether there is a circuit path within the new instance of the second lower level circuit that is DC path connected to the port of the new instance of the second lower level circuit that is DC path connected to the reference potential.

13. An article of manufacture that includes computer readable medium encoded with computer program code for use in evaluating a hierarchical representation of a circuit according to a method comprising:

traversing at least a portion of a higher level circuit in the design that includes a reference potential connection to identify one or both of a port of a call to a first lower level circuit in the design that is DC path connected to the reference potential or a port of a call to a second lower level circuit in the design that is DC path connected to the reference potential;

traversing at least a portion of the first lower level circuit to identify one or more calls to the second lower level circuit and to identify one or more ports of such one or more calls to the second lower level circuit that is DC path connected the reference potential;

determining a respective DC port signature for each identified call to the second lower level circuit;

producing a respective new instance of the second lower level circuit to represent each respective different occurrence of the second lower level circuit having a different respective DC port signature;

respectively traversing at least a portion of each respective new instance of the second lower level circuit that has at least one port DC connected to the reference potential, to determine whether a respective circuit path within such respective new instance is DC path connected to the at least one port of the such respective new instance that is DC path connected to the reference potential.

14. A system for use in evaluating a hierarchical representation of a circuit according to a method comprising:
- means for traversing at least a portion of a higher level circuit in the design that includes a reference potential connection to identify one or both of a port of a call to a first lower level circuit in the design that is DC path connected to the reference potential or a port of a call to a second lower level circuit in the design that is DC path connected to the reference potential;
- means for traversing at least a portion of the first lower level circuit to identify one or more calls to the second lower level circuit and to identify one or more ports of such one or more calls to the second lower level circuit that is DC path connected the reference potential;
- means for determining a respective DC port signature for each identified call to the second lower level circuit;
- means for producing a respective new instance of the second lower level circuit to represent each respective different occurrence of the second lower level circuit having a different respective DC port signature;
- means for respectively traversing at least a portion of each respective new instance of the second lower level circuit that has at least one port DC connected to the reference potential, to determine whether a respective circuit path within such respective new instance is DC path connected to the at least one port of the such respective new instance that is DC path connected to the reference potential.

15. An article of manufacture that includes computer readable medium encoded with computer program code for use in evaluating a hierarchical representation of a circuit according to a method comprising:
- traversing at least a portion of a higher level circuit that includes a reference potential connection to identify a port of a call to a first lower level circuit that is DC path connected to the reference potential;
- identifying a first DC port group that includes each one or more ports of the call to the first lower level circuit that is DC path connected to the identified port of the call to the first lower level circuit;
- automatically marking as DC path connected to the reference potential, the one or more ports of the first DC port group that includes the identified port of the call to the first lower level circuit; and
- determining a DC port signature for the call to the first lower level circuit having the identified port DC connected to the reference potential;
- wherein the DC port signature identifies at least the port of such call to the first lower level circuit that is DC path connected to the reference potential;
- producing a new instance of the first lower level circuit that corresponds to the DC port signature and that represents the call to the first lower level circuit having the identified port; and
- traversing at least a portion of the respective new instance of the first lower level circuit to identify a circuit path within the new instance that is DC path connected to the port of the new instance that is DC path connected to the reference potential.

16. A system for use in evaluating a hierarchical representation of a circuit according to a method comprising:
- means for traversing at least a portion of a higher level circuit that includes a reference potential connection to identify a port of a call to a first lower level circuit that is DC path connected to the reference potential;
- means for identifying a first DC port group that includes each one or more ports of the call to the first lower level circuit that is DC path connected to the identified port of the call to the first lower level circuit;
- means for automatically marking as DC path connected to the reference potential, the one or more ports of the first DC port group that includes the identified port of the call to the first lower level circuit; and
- means for determining a DC port signature for the call to the first lower level circuit having the identified port DC connected to the reference potential;
- wherein the DC port signature identifies at least the port of such call to the first lower level circuit that is DC path connected to the reference potential;
- means for producing a new instance of the first lower level circuit that corresponds to the DC port signature and that represents the call to the first lower level circuit having the identified port; and
- means for traversing at least a portion of the respective new instance of the first lower level circuit to identify a circuit path within the new instance that is DC path connected to the port of the new instance that is DC path connected to the reference potential.

* * * * *